United States Patent
Takahashi et al.

(12)

(10) Patent No.: US 6,816,232 B2
(45) Date of Patent: Nov. 9, 2004

(54) SUPPORT DEVICE AND MANUFACTURING METHOD THEREOF, STAGE DEVICE, AND EXPOSURE APPARATUS

(75) Inventors: Masato Takahashi, Kumagaya (JP); Koji Yamamoto, Kumagaya Saitama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/634,904

(22) Filed: Aug. 6, 2003

(65) Prior Publication Data

US 2004/0083966 A1 May 6, 2004

(30) Foreign Application Priority Data

Aug. 6, 2002 (JP) ........................................ 2002-228943
Aug. 12, 2002 (JP) ........................................ 2002-234988

(51) Int. Cl.[7] ............................................. G03B 27/42
(52) U.S. Cl. ........................................................ 355/53
(58) Field of Search .............................. 355/30, 53, 77; 118/52, 718

(56) References Cited

U.S. PATENT DOCUMENTS

| 5,473,410 A | 12/1995 | Nishi .......................... 355/53 |
| 5,528,118 A | 6/1996 | Lee ........................ 318/568.17 |
| 5,923,853 A | 7/1999 | Danneels ............... 395/200.68 |
| 6,327,024 B1 | 12/2001 | Hayashi et al. ............... 355/53 |

FOREIGN PATENT DOCUMENTS

| JP | A 5-340444 | 12/1993 |
| JP | A 8-166043 | 6/1996 |
| JP | A-2001-332477 | 11/2001 |

*Primary Examiner*—D. Rutledge
(74) *Attorney, Agent, or Firm*—Oliff & Berridge PLC

(57) ABSTRACT

To provide a low-stiffness air spring function without increasing the size of the equipment, a support frame, which supports a first gas chamber that is filled with a gas and that supports an object using the gas, is modified so that there is a second gas chamber, connected to the first gas chamber, provided within the support frame.

27 Claims, 11 Drawing Sheets

SUPPORT DEVICE AND MANUFACTURING METHOD THEREOF, STAGE DEVICE, AND EXPOSURE APPARATUS

INCORPORATION BY REFERENCE

This application is based on Japanese Patent Application 2002-228943 filed Aug. 6, 2002 and Japanese Patent Application 2002-234988 filed Aug. 12, 2002, the disclosures of which are incorporated herein by reference in their entireties.

BACKGROUND OF THE INVENTION

1. Field of the Invention

The present invention relates to support devices in which a gas chamber that supports an object using gas is supported on a support frame, the manufacturing method thereof, stage devices that incorporate such support devices, and to exposure apparatus that include such stage devices and that are used in manufacturing, for example, semiconductor integrated circuits and liquid crystal displays.

2. Description of Related Art

Conventionally, in lithography processes, which are processes used in manufacturing semiconductor devices, a variety of different exposure apparatus have been used to transfer onto a substrate, such as a wafer or glass plate coated with resist (a photosensitive material), circuit patterns fabricated on masks or reticles (hereinafter termed "reticles").

For example, reduction projection exposure apparatus, which use projection optical systems to reduce and transfer onto wafers patterns from reticles, have been used as the primary exposure apparatus for semiconductor devices, given the miniaturization of the minimum line widths of the patterns (the device scale) accompanying the increased levels of integration in integrated circuits in recent years.

Step-and-repeat type stationary exposure reduction projection exposure apparatus (so-called "steppers"), in which the reticle pattern is transferred sequentially to multiple shot regions (exposure regions) on a wafer, and step-and-scan type scanning exposure apparatus (so-called "scanning steppers"), in which, as an improvement to the steppers, the reticle pattern is transferred to each shot region on the wafer as the reticle and the wafer synchronously move in one dimension, as disclosed in Japanese Patent Publication Laid-Open No. 8-166043, are known as types of reduction projection exposure apparatus.

In these types of reduction projection exposure apparatus, often the stage device includes a main column, which supports the reticle stage, the wafer stage, the projection optical system (the projection lens), and the like, that is mounted on an anti-vibration platform to eliminate floor vibrations, and which is mounted on a base plate, which is provided as a foundation that is first placed on the floor. In recent years, the stage devices have included active anti-vibration platforms, in which air mounts having a controllable internal pressure, and actuators such as voice coil motors (devices that provide a linear force) have been provided and mounted on the main column (the main frame), and the forces of the aforementioned voice coil motors, etc., are controlled based on measurement values from, for example, six accelerometers.

FIG. 15 shows one example of a support device with an air mount. The support device shown in this figure is one in which an air mount 81, as an air spring, is supported on a support frame 82. The air mount 81 is equipped with a pressure sensor 84, which senses the pressure in an internal space 83, where air at a specific pressure is released or filled through a servo valve 85 based on the detection results of the pressure sensor 84. The air mount 81 is equipped with a piston 87, which is supported by a diaphragm 86 in such a way that it can move freely, and, using the air of the internal space 83, the piston 87 supports the object to be supported 88, such as the projection lens or the stage. Thus, by interposing the air mount 81 as an air spring between the object 88 and the support frame 82, the vibrations propagated to the projection lens, the stage, or the like, from the support frame 82 through the object 88 are controlled.

In addition, an anti-vibration device equipped with a voice coil motor in an air mount is disclosed in Japanese Patent Publication Laid-Open No. 5-340444.

SUMMARY OF THE INVENTION

However, the conventional technologies described above have problems such as described below. When it comes to vibration control, the lower the stiffness of the air spring, the better. However, because the stiffness of the air spring and the volume of the air spring are inversely proportional, a large volume is required in order to obtain a low-stiffness air spring. Given this, although one may consider increasing the volume of the internal space in the air mount or consider attaching an air tank to the air mount, in either case it would directly cause the equipment to be larger, and it would be difficult to secure the large volume, given footprint constraints (i.e., constraints on the floor space for installation).

In particular, recent years have seen steadily increasing demands for further miniaturization in semiconductor devices and for faster exposure processes, and although a variety of methods have been investigated by which to prevent the vibrations from the floor in the factories in which the exposure equipment is installed, and the vibrations accompanying the movement of the stage within the exposure equipment, from reaching the projection lens, the constraints on the space within the exposure equipment limit the volume of the air spring, so there is a danger that it will become impossible to satisfy the increasingly strict anti-vibration performance requirements for future exposure apparatus.

Furthermore, given only the description in Japanese Patent Publication Laid-Open No. 5-340444, it is not possible to apply the anti-vibration device disclosed in Japanese Patent Publication Laid-Open No. 5-340444 to high-precision equipment such as exposure apparatus.

The present invention was created in consideration of the above, and one of its objects is to provide a support device that functions as a low-stiffness air spring, without increasing the size of the equipment, and to provide a manufacturing method of the support device, as well as provide a stage device incorporating the support device, and an exposure apparatus having the stage device.

In order to achieve the objects described above, as well as other objects, the present invention provides various features.

A support device according to one aspect of the present invention includes a first gas chamber that is filled with a gas at a specified pressure and that supports an object using the gas, and a support frame that supports the first gas chamber, wherein a second gas chamber, connected to the first gas chamber, also is provided within the support frame.

In the support device according to this aspect of the present invention, the volume of the air spring will be the volume of the second gas chamber and the volume of the first gas chamber, making it possible to reduce the stiffness of the air spring. Furthermore, because the second gas chamber is provided within the support frame, it is possible to prevent increases in the size of the equipment, such as would occur when the volume of the first gas chamber is increased or when an air tank is added to the first gas chamber.

In addition, the stage device may include a stage unit that moves on a platform, wherein the platform is supported by the support device. In such a stage device, the low-stiffness air spring makes it possible to support changes in the load on the platform caused by moving the stage unit, and makes it possible to prevent the propagation of floor vibrations to the platform.

According to another aspect of the present invention, an exposure apparatus includes a projection optical system to expose a pattern of a mask that is supported on a mask stage, onto a photosensitive substrate that is supported on a substrate stage, wherein at least one of the mask stage, the projection optical system, and the substrate stage is supported by a support device according to any of the various aspects of the invention. In the exposure apparatus according to aspects of the present invention, the low-stiffness air spring makes it possible to support changes in the load on the platform caused by moving the mask stage or the substrate stage, and makes it possible to prevent the propagation of floor vibrations to the platform or to the projection optical system.

Another aspect of the invention relates to a manufacturing method for a support device that is provided with a first gas chamber which is filled with a gas at a specified pressure and that supports an object using the gas, and a support frame that supports the first gas chamber, comprising: a step of forming a casting mold of the support frame by providing a first core within the mold that has a hollow part, and by providing a second core that is in contact with the first core and the mold; a step of injecting molten material into the mold; and a step of, after the material that has been injected has cooled, removing the mold, the first core, and the second core, to form a second gas chamber, which can connect to the first gas chamber.

In the manufacturing method for the support device according to this aspect of the present invention, it is possible to form a second gas chamber, which forms an air spring volume, in addition to the volume of the first gas chamber, within the support frame, thus making it possible to reduce the stiffness of the air spring. This second gas chamber is provided within the support frame, and thus is able to prevent the size of the equipment from increasing, as would be the case if the volume of the first gas chamber were increased, or if an air tank were added to the first gas chamber.

A support device according to another aspect of the present invention has a support surface that supports an object, a gas chamber that is filled with gas to a specified pressure and that uses the gas to support the object, in a first direction that is perpendicular to the support surface, a drive device that is disposed in the gas chamber and that uses an electromagnetic force to drive the object in the first direction, and a temperature adjustment device that adjusts the temperature of the drive device. In the support device according to this aspect of the present invention, an increase in size of the equipment can be prevented by disposing the drive device within the gas chamber. Furthermore, the direction in which the object is supported by the gas chamber, and the direction in which the object is driven by the drive device, can be coaxial, making it possible to prevent deformation, or the like, of the object because no torque will be applied to the object. In addition, because the temperature adjustment device adjusts the temperature of the drive device, the object will not be affected by the heat produced by the driving of the drive device.

The stage device may include a stage unit that moves on a platform, wherein the platform is supported by the support device. In the stage device according to this aspect of the present invention, variations in the load on the platform due to movements of the stage unit can be supported by the drive device and by the gas chamber, and even the elimination of the floor vibrations can be done without increasing the size of the equipment, while, additionally, it is possible to prevent any deformation, etc., of the object because no torque is applied to the platform. Furthermore, the stage unit is unaffected by heat generated by driving of the drive device.

An exposure apparatus according to another aspect of the present invention is an exposure apparatus in which a pattern of a mask held by a mask stage is exposed by a projection optical system onto a photosensitive substrate held on a substrate stage, wherein at least one of the mask stage, the projection optical system, and the substrate stage, is supported by the support device. In the exposure apparatus according to this aspect of the present invention, even if the mask stage or the substrate stage is moved, deformations, or the like, can be prevented because no torque is applied to the mask stage, the substrate stage, or the projection optical system. In addition, the mask stage and the substrate stage are not affected by heat generated by driving the drive device. Because of this, it is possible to prevent the reduction of the exposure accuracy without increasing the size of the equipment, and thus it is possible to handle miniaturization of devices with ease.

BRIEF DESCRIPTION OF THE DRAWINGS

The invention will be described in detail with reference to the following drawings, in which like reference numerals are used to identify similar elements, and wherein.

DETAILED DESCRIPTION OF PREFERRED EMBODIMENTS

Embodiments of a support device, a manufacturing method thereof, a stage device, and an exposure apparatus according to various aspects of the present invention will be explained below, referencing FIGS. 1 to 14.

Figure 15:
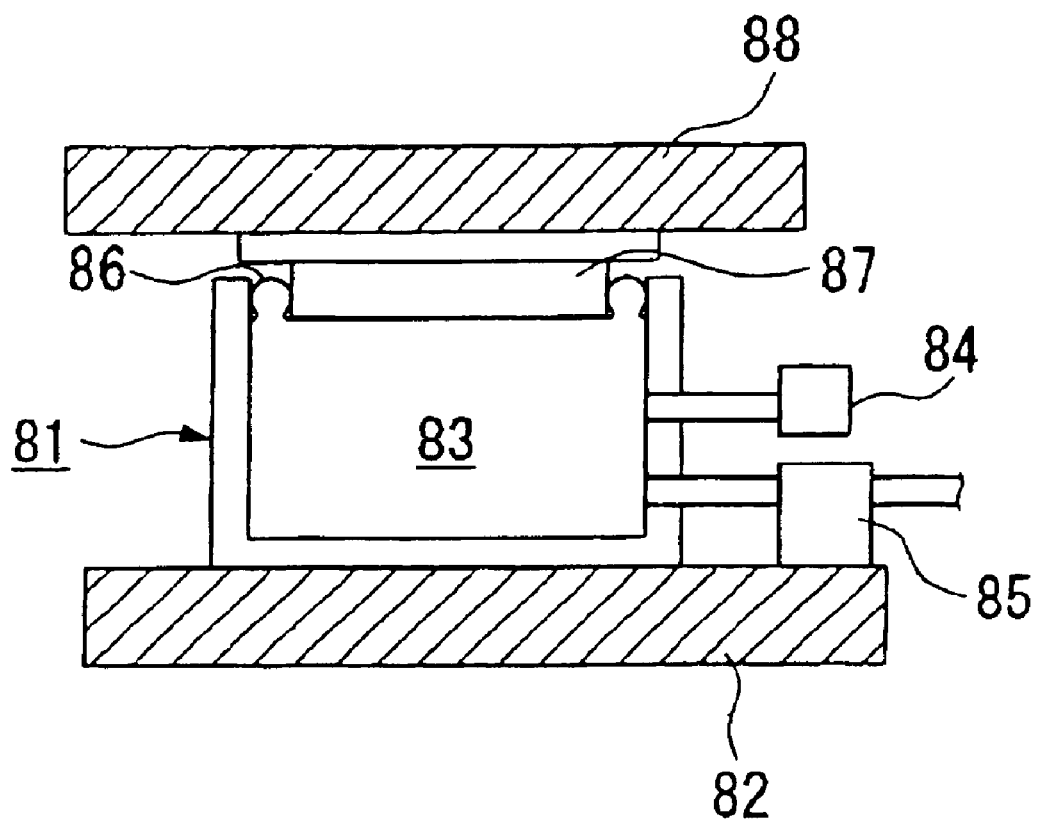
FIG. 15 is a drawing showing an example of an air mount according to conventional technology.

Here an explanation will be given using, as an example of an exposure apparatus, a scanning stepper, in which the semiconductor device circuit patterns formed on the reticle are transferred onto a wafer as the reticle and the wafer move synchronously. In addition, the support device according to the present invention in this exposure apparatus will be applied to an anti-vibration unit that supports the projection optical system on a platform. In these drawings, structural elements that are the same as those in FIG. 15, which shows a conventional example, are given the same symbols, and explanations thereof are omitted.

Figure 1:
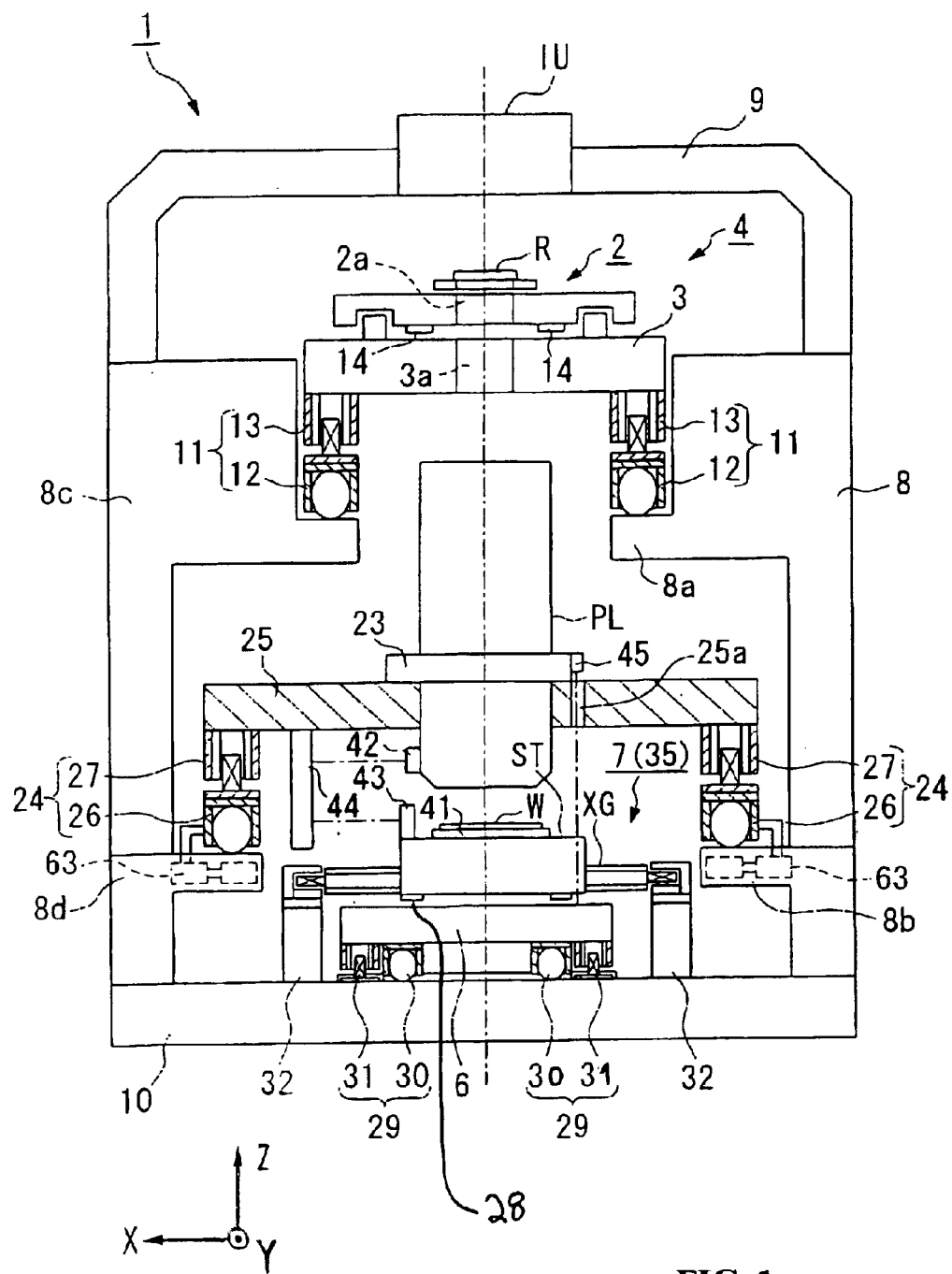
FIG. 1 is a schematic drawing of an exposure apparatus with an anti-vibration unit according to one exemplary embodiment of the present invention.

The exposure apparatus 1, shown in FIG. 1, includes an illumination optical system IU, which outputs with a uniform illumination intensity a rectangular (or arced) illumination region on the reticle (mask) R using an exposure illumination beam from a light source (not shown). The apparatus also includes a stage device 4 that includes a reticle stage (mask stage) 2 that holds a reticle R and that moves, and a reticle platform (or base) 3 that supports the reticle stage 2. The apparatus also includes a projection optical system PL that projects onto the wafer (substrate, photosensitive substrate) W the illumination beam that is radiated from the reticle R. The apparatus further includes a stage device 7 that includes a wafer stage (substrate stage) 5 that holds the wafer W and that moves, and a wafer platform (or base) 6 that supports the wafer stage 5. The apparatus also includes a reaction frame 8 that supports the stage devices 4 and 7 and the projection optical system. Note that the direction of the optical axis of the projection optics system PL is defined as the Z direction, the direction that is perpendicular to the Z direction and in which the reticle R and the wafer W move synchronously is defined as the Y direction, and the direction of asynchronous movement is defined as the X direction. The directions of rotation around the respective axes are defined as theta Z, theta Y, and theta X.

The illumination optical system IU is supported by a support column 9 secured to the top surface of the reaction frame 8. Note that the ultraviolet spectral lines (g-line and i-line) emitted from a high-pressure mercury lamp, the deep ultraviolet light (DUV beam) such as, for example, a KrF excimer laser beam (wavelength=248 nm), or a vacuum ultraviolet beam (VUV) from, for example, an ArF excimer laser beam (wavelength=193 nm) or an F2 laser beam (wavelength=157 nm) are used as examples of illumination beams for exposure.

The reaction frame 8 is disposed on a base plate 10, which is mounted level on the floor, and step parts 8a and 8b, which extend towards the inside, are fabricated at the top part and the bottom part of the reaction frame 8. This reaction frame 8 may be fabricated as a single unit, or, for convenience in manufacturing, may be fabricated into a single unit after fabricating the top part support frame 8c and the bottom part support frame 8d.

Within the stage device 4, the reticle platform 3 is supported, so as to be essentially level, by anti-vibration units 11 on the step parts 8a of the reaction frame 8 at each of its corners (the anti-vibration units that would be located behind the surface of the paper are not shown), and an opening 3a, through which the pattern image formed on the reticle R passes, is formed in the center thereof. The material for the reticle platform 3 may be metal or a ceramic. The anti-vibration units 11 are structured with an air mount 12, for which the inside pressure can be adjusted, and a voice coil motor 13 disposed in series on top of the step parts 8a. The minute vibrations that are propagated to the reticle platform 3 through the base plate 10 and the reaction frame 8 are insulated by these anti-vibration units 11 to the micro-G level (where G is the acceleration due to gravity).

On top of the reticle platform 3, the reticle stage 2 is supported in such a way that it can move in two dimensions along the reticle platform 3. Multiple air bearings (air pads) 14 are secured to the bottom surface of the reticle stage 2, and the reticle stage 2 is supported by floating above the reticle platform 3 with a clearance of several microns on these air bearings 14. In addition, an opening 2a, which is aligned with the opening 3a in the reticle platform 3, and through which the pattern image of the reticle R passes, is fabricated in the center of the reticle stage 2.

Figure 2:
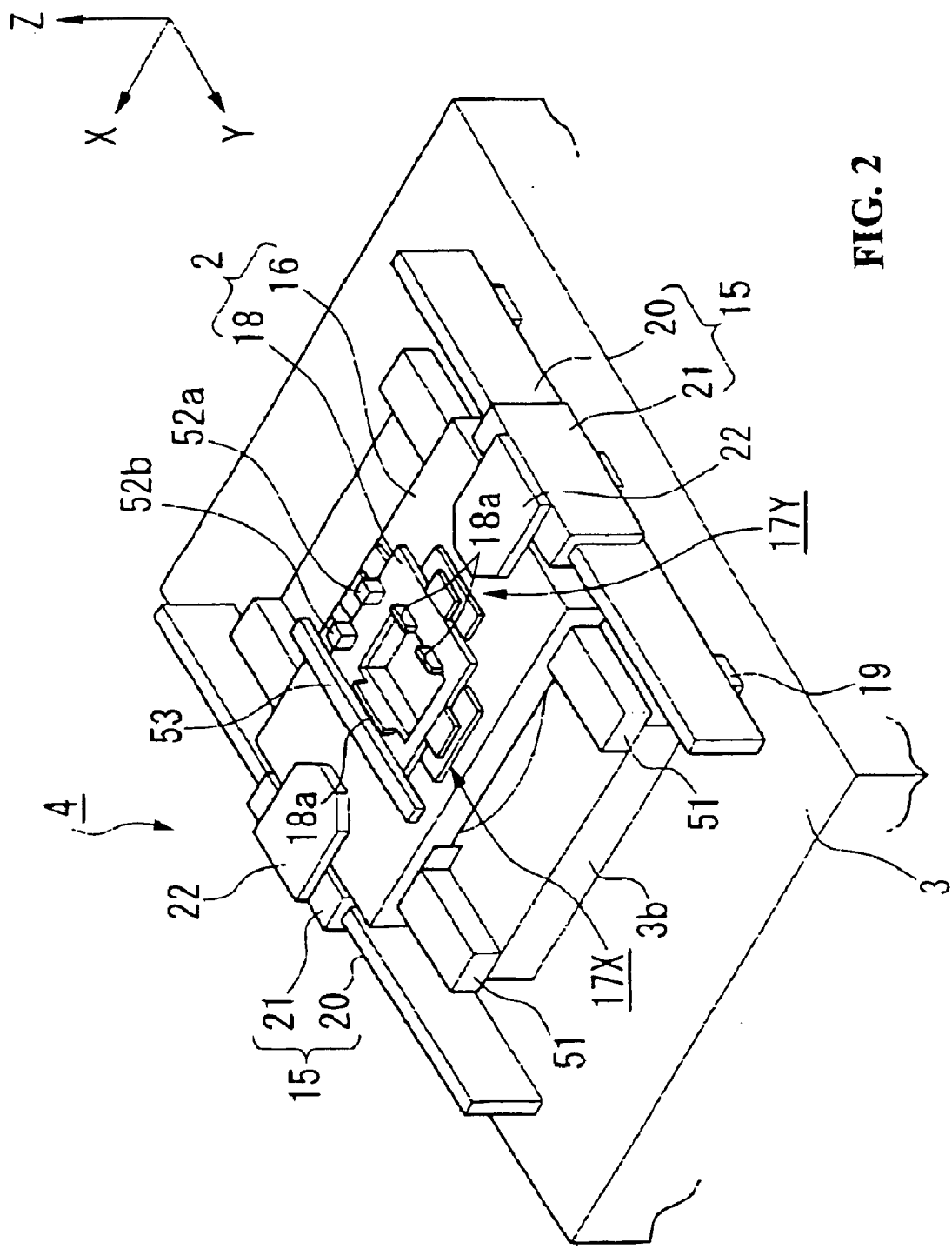
FIG. 2 is an external perspective drawing of the reticle stage provided in the FIG. 1 exposure apparatus.

As shown in more detail in FIG. 2, the reticle stage 2 includes a rough (or coarse) stage 16, which is driven with a specific stroke in the Y-axis direction on the reticle platform 3 by a pair of Y linear motors 15, and a reticle fine-movement stage 18, on this reticle rough stage 16, which is moved minutely in the X, Y, and theta Z directions by a pair of X voice coil motors 17X and a pair of Y voice coil motors 17Y. (Note that these stages are shown as a single stage in FIG. 1.)

Each Y linear motor 15 comprises a stator 20, which extends in the Y axis direction, and which floats on multiple air bearings (air pads) 19, which are non-contact bearings, above the reticle platform 3, and a movable element 21, which is secured to the reticle rough stage 16 through a linkage member 22, and which is disposed facing the stator 20. Because of this, due to the law of conservation of momentum, as the reticle rough stage 16 moves in the positive Y direction, the stator 20 moves in the negative Y direction. Not only is the reaction accompanying the movement of the reticle rough stage 16 canceled out by the movement of the stator 20, but changes in the position of the center of gravity are also prevented.

Note that the stator 20 can be disposed on the reaction frame 8 instead of on the reticle platform 3. When the stator 20 is disposed on the reaction frame 8, the air bearings 19 may be omitted, the stator 20 may be secured to the reaction frame 8, and the reaction force that is generated in the stator 20 due to the movement of the reticle rough stage 16 can be transmitted through the reaction frame 8 to the floor. Alternatively, the law of conservation of momentum, described above, may be used, whereby the stator 20 will be movably mounted on the reaction frame 8.

The reticle rough stage 16 is structured so as to be guided in the Y-axis direction by a pair of Y guides 51, which extend in the Y axis direction and which are attached to the top surface of the top protruding parts 3b, fabricated in the center part of the reticle platform 3. Furthermore, the reticle rough stage 16 is supported on these Y guides 51 by air bearings, not shown, without making contact with the guides 51.

The reticle fine movement stage 18 is structured so that the reticle R is held by the force of a vacuum through a vacuum chuck 18a. A pair of Y-movement mirrors 52a and 52b, made from a corner cube mirror, are secured on the edge part of the reticle fine movement stage 18 in the −Y direction. In addition, on the edge part of the reticle fine movement stage 18 in the +X direction, there is an X-movement mirror 53, made from a flat mirror that extends in the Y-axis direction. Furthermore, the position of the reticle stage 2 is measured with high precision in the X, Y, and theta Z (i.e., the direction of rotation around the Z axis) directions by measuring the distance from each of these movement mirrors using three laser interferometers (not shown) that emit measurement beams onto these movement mirrors 52a, 52b, and 53. The reticle fine movement stage 18 may be made from a metal, cordierite, or a ceramic made from sic.

Returning to FIG. 1, for the projection optical system PL, a refractive optical system with a reduction magnification ratio of 1/4 (or 1/5), made from refractive optical elements (lens elements) where quartz or fluorite glass is used as the optical glass material, and which has a circular projection field that is telecentric on both the object surface (reticle R) side and the image (wafer W) side is used. Thus, when the reticle R is illuminated by the illumination beam, the focused light beam from those circuit patterns on the reticle R that are illuminated by the illumination beam are incident on the projection optical system PL and an inverted image of part of the circuit pattern, limited into the shape of a slit, is formed in the center of the circular field on the image surface side of the projection optical system PL. Because of this, the projected partial inverted image of the circuit pattern is reduced and transferred into the resist layer on the surface of one shot region of the multiple shot regions on the wafer W, which is disposed in the focal plane of the projection optical system PL.

A flange 23, which is integrated with the barrel part of the projection optical system, is equipped on the outer periphery of the barrel part of the projection optical system PL. Additionally, the projection optical system PL, is inserted from the top, with the direction of the optical axis being the Z direction, into the barrel platform 25, which is structured as, for example, a casting which is supported so as to be essentially level on the anti-vibration units 24 using the step part 8b of the reaction frame 8 as a support device, and is mated with the flange 23. The barrel platform 25 may be made from a ceramic material that has high stiffness and a low coefficient of thermal expansion.

For the material for the flange 23, a material with a low coefficient of thermal expansion, for example INVER (an alloy with a low coefficient of thermal expansion made from iron with 36 percent nickel, 0.25 percent manganese, and trace amounts of carbon and other elements), is used. This flange 23 forms a so-called kinematic support mount, supporting the projection optical system PL relative to the barrel platform 25 at three points with a point, a surface, and a V-shaped groove. The use of this type of kinematic support structure makes it easy to attach the projection optical system PL to the barrel platform 25, and also has the benefit of being able to most effectively reduce stresses resulting from, for example, vibrations and changes in temperature in the barrel platform 25 and the projection optical system PL after assembly.

The anti-vibration units 24 are disposed on the points of a triangle (the anti-vibration unit that would be behind the surface of the paper is not shown), and are structured from an air mount 26, which has an adjustable inner pressure, and a voice coil motor 27 disposed in series on a step part 8b. The fine vibrations that are propagated through the base plate 10 and the reaction frame 8 to the barrel platform 25 (and by extension, to the projection optical system PL) are insulated (attenuated) by these anti-vibration units 24 down to the micro-G level (where G is the acceleration due to gravity). Details of the anti-vibration unit 24 will be discussed later.

The stage device 7, as is clear from FIG. 1, is disposed on the base plate 10 separate from the stage device 4 and from the projection optical system PL. The stage device 7 comprises, primarily, a wafer stage 5, a wafer platform 6 that supports the wafer stage 5 in such a way that it can move in two dimensions along the XY plane, an object platform ST that uses the force of a vacuum to hold a wafer W, and that is integrated with the wafer stage 5, and an X guide bar XG, which supports the wafer stage 5 and the object platform ST in such a way that they can move freely relative to the X guide bar XG. Multiple air bearings (air pads) 28, which are non-contact bearings, are provided on the bottom surface of the wafer stage 5, where these air bearings 28 cause the wafer stage 5 to float above the wafer platform 6 with a clearance of, for example, several microns.

The wafer platform 6 is held essentially level on the base plate 10 by the anti-vibration units 29, which are disposed on the corners of a triangle (the anti-vibration unit that would be behind the surface of the paper is not shown). The anti-vibration units 29 are structured from an air mount 30, which has an adjustable inner pressure, and a voice coil motor 31, which pushes on the wafer platform 6, disposed in parallel on the base plate 10. The fine vibrations that are propagated to the wafer platform 6 through the base plate 10 are insulated by these anti-vibration units 29 to the micro-G level (where G is the acceleration due to gravity).

Figure 3:
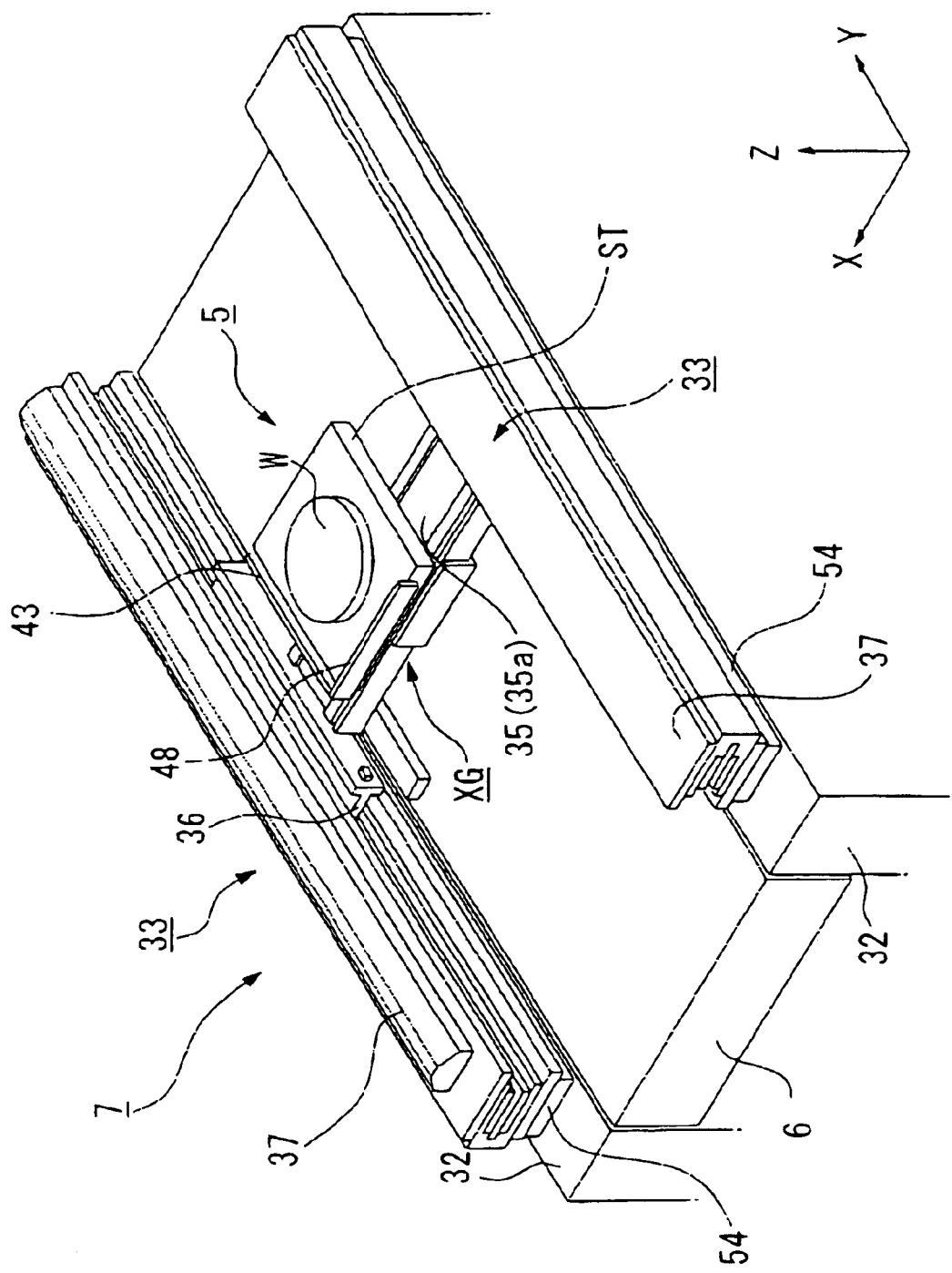
FIG. 3 is an external perspective drawing of the wafer stage provided in the FIG. 1 exposure apparatus.

A wafer W is held by the force of a vacuum by a wafer holder 41 located on the top surface of the wafer stage 5 (see FIG. 1; not shown in FIG. 3). Additionally, the position of the wafer stage 5 in the X direction is measured in real-time with a resolving power, for example, a resolving power of about 0.5 to 1 nm, by a laser interferometer 44 that measures the change in position of a movement mirror 43, attached to a part of the wafer stage 5, using as a reference a reference mirror 42 that is secured to the bottom end of the barrel of the projection optical system PL. The wafer stage position in the Y direction is measured by a reference mirror and laser interferometer (not shown), and a movement mirror 48 (see FIG. 3), which are disposed essentially orthogonal to the aforementioned reference mirror 42, movement mirror 43, and laser interferometer 44. Of these laser interferometers, at least one is a multi-axis interferometer that has two or more measurement axes, making it possible to measure the amount of theta rotation, and, additionally, the leveling, rather than just the XY position of the wafer stage 5 (and by extension, of wafer W) based on the measurement values from these laser interferometers.

Figure 12:
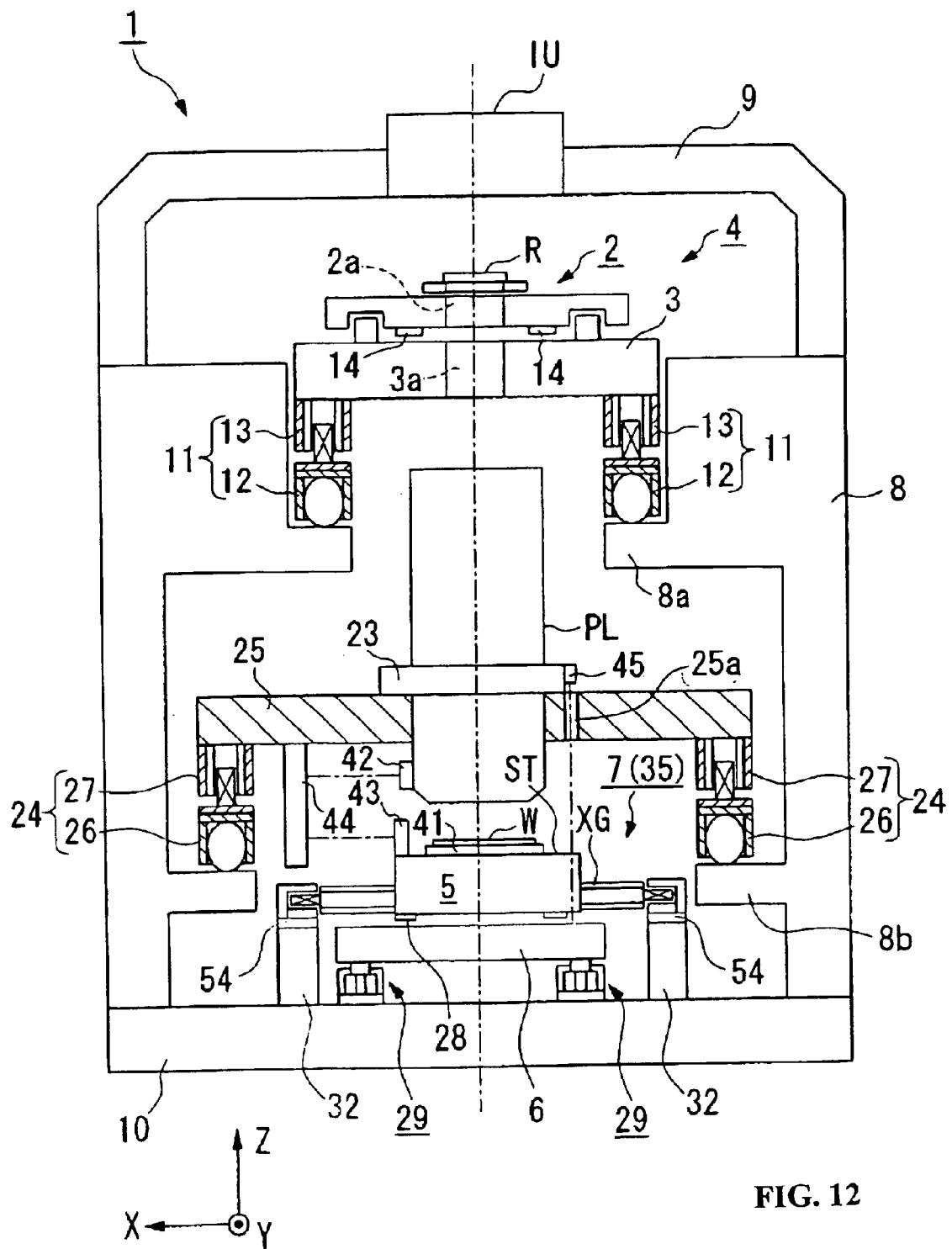
FIG. 12 is a schematic structural drawing of an exposure apparatus according to another exemplary embodiment of the present invention.

Three laser interferometers 45 are affixed in three different places to the flange 23 of the projection optical system PL as detector devices for detecting the relative positioning of the wafer platform 6 in the Z direction. (Note that in FIG. 1 and FIG. 12, which will be discussed later, these laser interferometers are represented by only a single laser interferometer.) Openings 25a are formed in the parts of the barrel platform 25 that face each of the laser interferometers 45, and the Z-direction laser beams (the measurement beams) from each of these laser interferometers 45 are directed through these openings 25a towards the wafer platform 6. Reflector surfaces are fabricated at each of the positions on the top surface of the wafer platform 6 that face the respective measurement beams. Because of this, the aforementioned three laser interferometers 45 can measure the Z-axis position of three different points on the wafer platform 6 using the flange 23 as a reference. (FIG. 12 shows a case where the measurement beam passes in front of the wafer stage 5.) Note that, instead, a reflector surface can be formed on the top surface of the wafer stage 5, and interferometers can be provided to measure the Z-axis positions of three different points on this reflector surface using the projection optical system PL or the flange 23 as the reference.

Furthermore, three vibration sensors that measure vibrations in the Z direction (for example, accelerometers; not shown), and three vibration sensors that measure vibrations in the directions in the XY plane (for example, accelerometers; not shown) are attached to each of the aforementioned reticle platform 3, wafer platform 6, and barrel platform 25. Two of these latter acceleration sensors measure the vibration in the Y direction of each of the platforms, and the remaining vibration sensors measure the vibration in the X direction (for convenience, these vibration sensors will be referred to as a "set of vibration sensors" hereafter). Based on the measurement values of these sets of vibration sensors, the vibrations of the reticle platform 3, the wafer platform 6, and the barrel platform 25 can each be measured with six degrees of freedom (X, Y, Z, theta X, theta Y, theta Z).

As shown in FIG. 3, the X guide bar XG is rectangular, extending in the X direction, and the movable elements 36 only one of the movable elements 36 is shown in FIG. 3, which are made from motor units, are equipped on each lengthwise end thereof. The stators 37, which have magnet units corresponding to the movable elements 36, are equipped on air pads 54 on side platforms 32, which protrude from the base plate 10. Thus, moving coil-type linear motors 33 are formed from the movable elements 36 and stators 37, and by driving the movable elements 36 using the electromagnetic interaction with the stators 37, not only is the X guide bar XG moved in the Y direction, but also there can be rotational movement around the theta Z axis by driving the linear motors 33 and 33 by slightly different amounts.

In other words, the structure is one wherein the linear motors 33 drive the wafer stage 5 (including the object platform ST, referred to simply as the "wafer stage 5," below) essentially as a single unit with the X guide bar XG in the Y direction and in the theta Z direction. Note that the wafer stage 5 is a guideless stage, having no guide member for the movement in the Y direction; however, as appropriate, the wafer stage 5 can be made as a guideless stage regarding the movement in the X direction as well.

The stators 37 each float on the side platforms 32, which are provided independently (in terms of vibration) of the wafer platform 6 on either X-direction side of the wafer platform 6, doing so on air pads 54 so as to be able to move freely in the Y direction. The air pads 54 have guide mechanisms in the Y direction. Because of this, the law of conservation of momentum causes the stators 37 to move, for example, in the −Y direction when there is movement of the wafer stage 5 in the +Y direction. In other words, the stators 37 function as countermasses, and not only does their movement cancel out the reaction forces of the movement of the wafer stage 5, but they are also able to prevent changes in the center of gravity of the overall system.

Note that in the stator 37 disposed on the +X side (the left-hand side in FIG. 3), an inclined surface is fabricated in order to guide the various types of utility supply cables, such as the air hoses, the cooling hoses, and the system wiring such as power lines and signal lines, that are connected to the X guide bar XG and to the movable element 36, without generating focused stresses (i.e., to mitigate the stresses). (Note that the same shape is used for convenience in FIG. 1.)

The wafer stage 5 is supported and held by a magnetic guide comprising an actuator and a magnet that maintains a specified gap in the Z direction with the X guide bar XG, without touching, so that the wafer stage 5 can move freely relative to the X guide bar XG in the direction of the X guide bar XG. Furthermore, the wafer stage 5 is driven in the X direction by the electromagnetic interaction of the X linear motor 35, which has a stator 35a that is embedded in the X guide bar XG. Although the movable element of the X linear motor is not shown, it is attached to the wafer stage 5.

Figure 4:
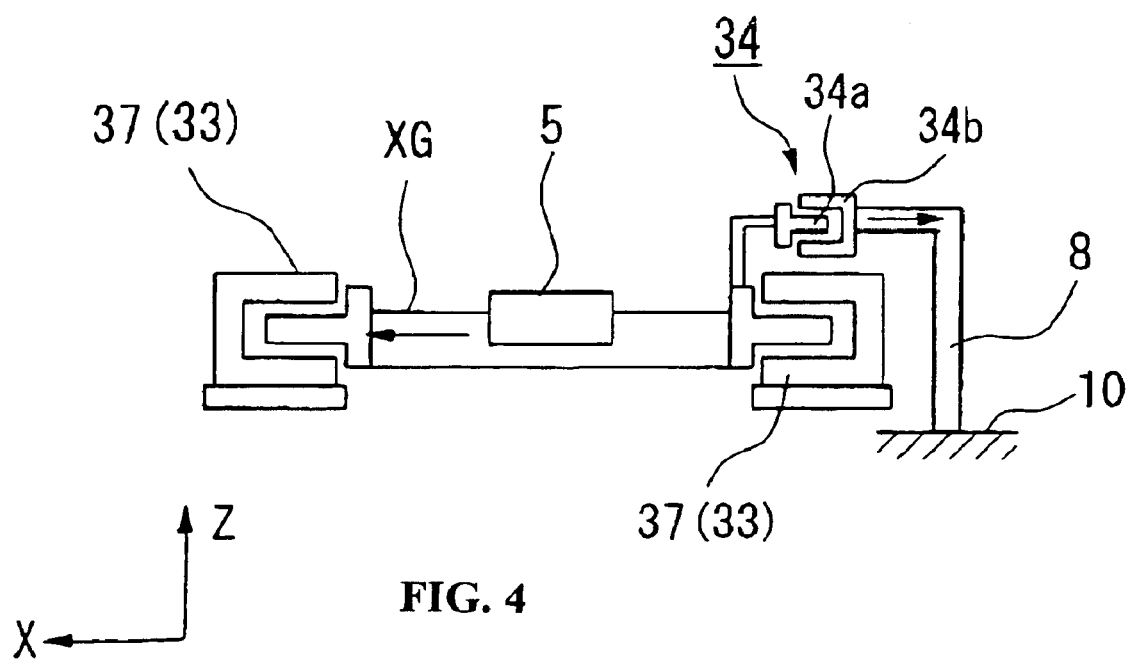
FIG. 4 is a schematic front view of the FIG. 3 wafer stage.

Furthermore, as shown in FIG. 4, the movable element 34a of an X trim motor 34, structured from a voice coil motor, is attached to the −X side of the X guide bar XG. The X trim motor 34 is interposed between the X guide bar XG and the reaction frame 8 as the stator for the X linear motor 35, and the stator 34b thereof is attached to the reaction frame 8. Because of this, the reaction force when the wafer stage 5 is driven in the X direction is propagated through the X trim motor 34 to the reaction frame 8, and then propagated to the baseplate 10 through the reaction frame 8, preventing vibrations from being transmitted to the wafer platform 6. While the X trim motor 34 actually is disposed on both Z-direction sides of linear motor 33, for convenience in FIG. 4, only the X trim motor 34 on the +Z side is shown.

Figure 5:
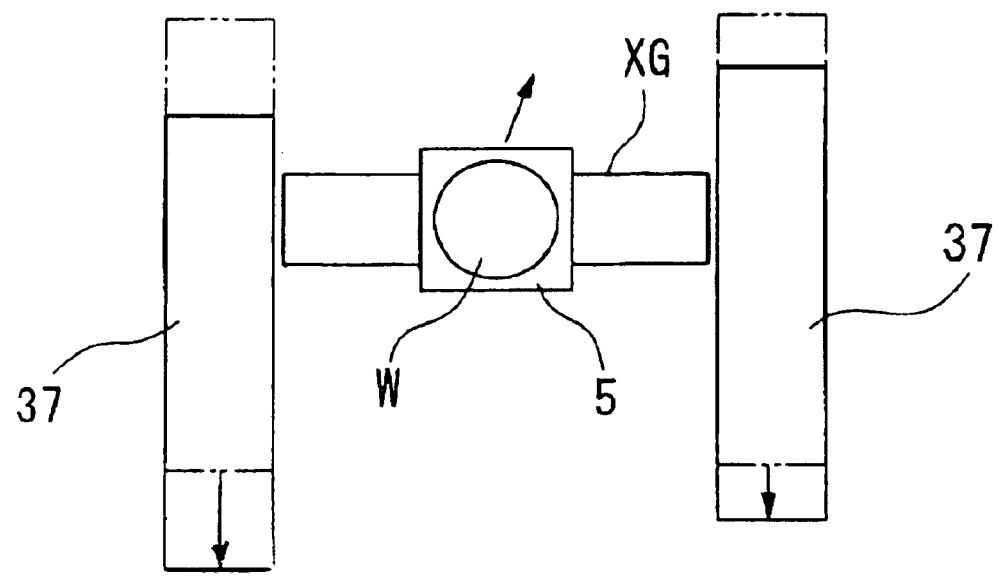
FIG. 5 is a schematic top view of the FIG. 3 wafer stage.

A trim motor (not shown) to correct for movement of the stator based on the momentum when the wafer stage 5 is moving is attached to the stator 37. This trim motor is structured from a shaft motor that comprises a movable element shaped like a cylindrical rod that extends in the Y direction to the Y end part of the stator 37, for example, and a stator that drives the movable element in the Y direction. As shown in FIG. 5, when the wafer stage 5 moves in both the X direction and the Y direction, or when the wafer stage 5 moves from a position that is off-balance from the center of the X guide bar XG, because the left and right stators 37 each undergo differing displacements due to the thrust component, and because of the coupling between the movable element 36 and the stator 37, when force is exerted to stop these elements at the initial position when there has been offsetting motion, the stators 37 will move to a position that is different from the position to which they are supposed to move. Because of this, the structure is such that the trim motor is driven, based on the momentum when the wafer stage 5 moves, to correct for the amount of movement (the momentum) so that the stator 37 will arrive at the specified location.

Figure 6:
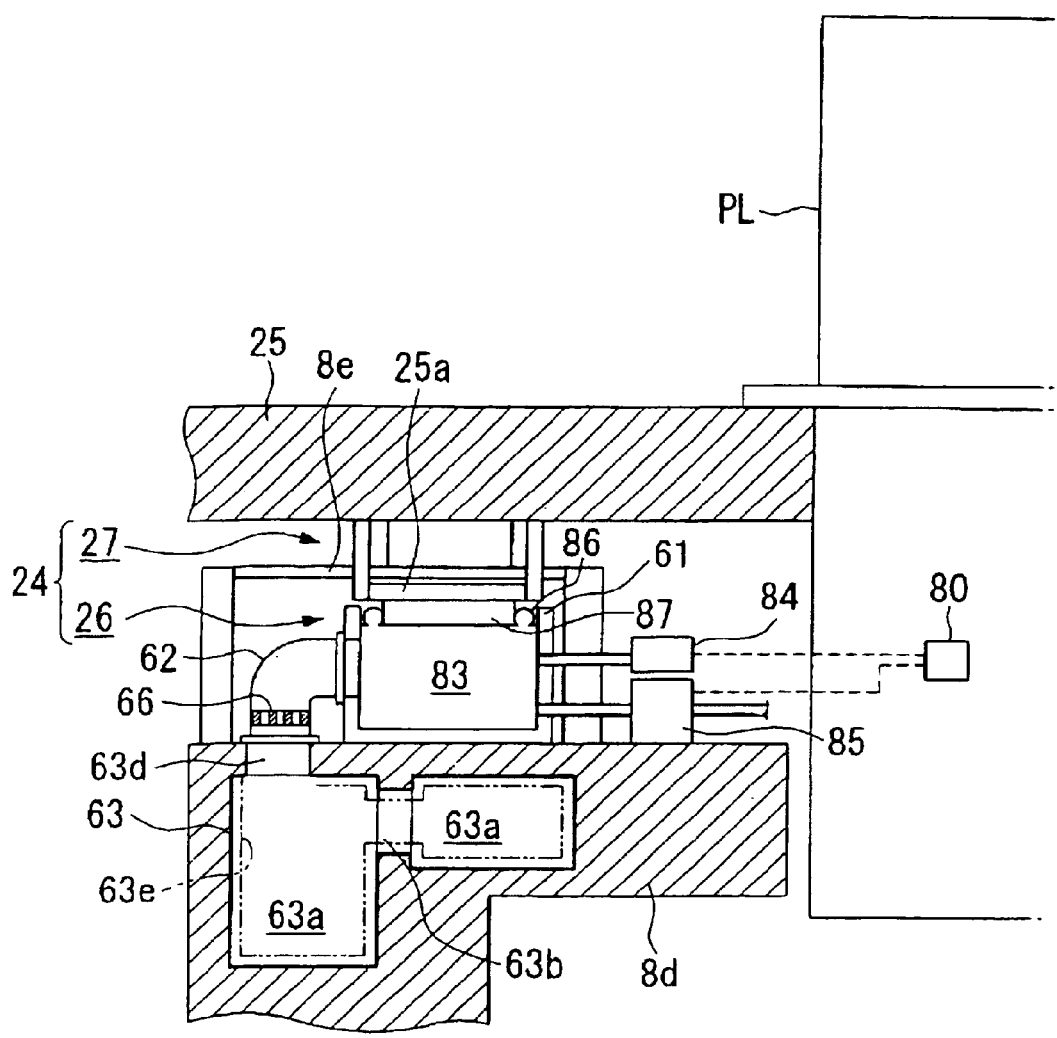
FIG. 6 is a schematic structural drawing of an anti-vibration unit according to an exemplary embodiment of the present invention.

FIG. 6 shows a schematic structural diagram of an anti-vibration unit 24. The anti-vibration unit 24 is structured, primarily, from an air mount 26, which is filled with air (a gas) to a specified pressure, and supports the projection optical system PL through the barrel platform 25 using the pressure of this air, and a voice coil motor (drive device) 27 that drives the projection optical system PL, using an electromagnetic force, in the Z direction, in which the air mount 26 supports the projection optical system PL.

The air mount 26 is structured essentially from a first air chamber (first gas chamber) 61 that is supported by a bottom support frame 8d, a second air chamber (second gas chamber) 63 that is connected to the first air chamber 61 through a duct (a connection part) 62, a pressure sensor (detection device) 84 that detects the air pressure in the inner space 83 of the first air chamber 61, a servo valve 85 that switches between increasing pressure and decreasing pressure and that is connected to an air pressure adjustment device, not shown, that increases or decreases the pressure in the inner space 83, and a control device 80 that controls the servo valve 85 based on the detection results of the pressure sensor 84.

The first air chamber 61 is equipped with a piston 87, which supports the barrel platform 25 (the projection optical system PL) in the Z direction through a frame 25a that is equipped perpendicular to the barrel platform 25, depending on the air pressure in the inner space 83, and a diaphragm 86 that supports the piston 87 so as to allow it to move freely in the Z direction relative to the first air chamber 61.

The second air chamber 63 is structured from cavities 63a, provided in the bottom support frame 8d, and through parts 63b, which connect between these cavities 63a and 63a. The second air chamber 63 is connected to the inner space 83 of the first air chamber 61 through a duct 62 and an introduction aperture 63d fabricated in the bottom support frame 8d.

Figure 7:
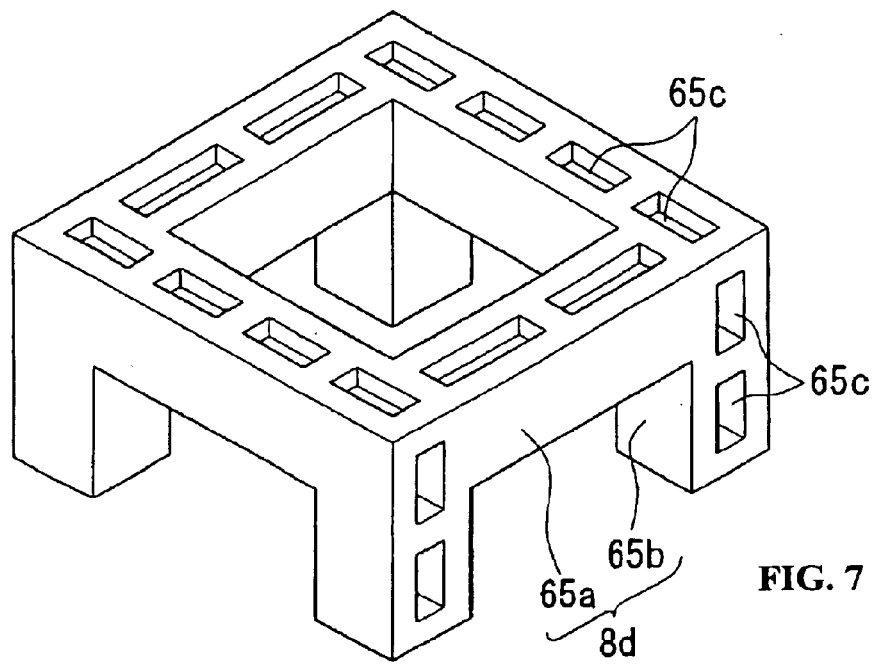
FIG. 7 is an external perspective drawing of the bottom support frame that supports the first air chamber in the FIG. 6 anti-vibration unit.

The bottom support frame 8d will be explained next. This bottom support frame 8d, as a casting made in a casting process, is shaped like a short table with a frame part 65a and legs 65b, as shown in FIG. 7. Multiple hollow parts (cavities) 65c, but not so many as to compromise mechanical strength, are fabricated in the frame part 65a and the legs 65b in order to reduce the weight thereof. INVER, mentioned above, or gray cast iron (FC), ductile cast iron (FCD), other types of cast iron, stainless steel, or the like, can be used for the materials for the bottom support frame 8d.

Additionally, for the second air chamber 63, not only are suitable hollow parts 65c selected as the cavities 63a depending on the disposition of the air mount 26, but the number of the cavities is made according to a ratio with the volume of the inner space 83 of the first air chamber 61, and through parts 63b are fabricated to connect the selected cavities 63a.

Furthermore, because there is a chance that there will be blowholes (i.e., vents) in the bottom support frame 8d caused by the casting process, in the present embodiment, the surfaces of the cavities 63a (i.e., the hollow parts 65c) selected as the second air chamber 63 and of the through parts 63b are coated, using a method such as firing, with a surface treatment material 63e to cover any blowholes and prevent the air from leaking out.

Here the spring constant of the air spring in the air mount 26 is expressed by the following formula:

$$K=(\gamma \times Pa \times A2)/(V+Vs) \qquad (1)$$

where $\gamma$=the polytropic index, Pa=the internal pressure, A=the effective pressure bearing area, V=the volume of the first air chamber, and Vs=the volume of the second air chamber.

As is clear from Equation (1), the spring constant K of the air spring is inversely proportional to the volume, and so the greater the volume, the lower the stiffness of the spring. Furthermore, if the volume of the first air chamber 61 is held constant, then the spring constant K will be inversely proportional to the ratio of the volume of the second air chamber 63 to the volume of the first air chamber 61.

Figure 8:
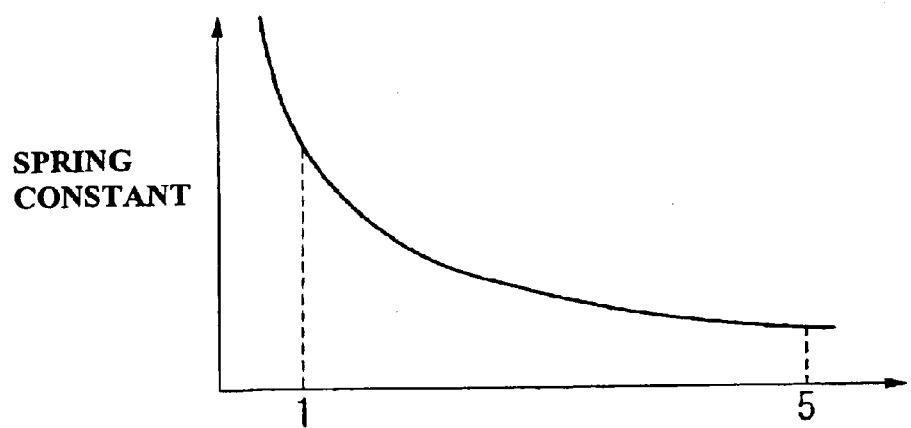
FIG. 8 is a drawing showing the relationship between the spring constant and the ratio of the volume of the second air chamber to the volume of the first air chamber.

FIG. 8 shows the relationship between the spring constant and the ratio of the volume of the second air chamber 63 to the volume of the first air chamber 61. As is clear from this figure, as the volume ratio grows larger, the spring constant becomes smaller, and the stiffness of the air spring is thus reduced, yet the marginal reduction in the spring constant relative to the increase in the volume of the second air chamber 63 becomes small when the ratio of volumes exceeds 5, and the effect on reducing the stiffness thereafter is reduced. Conversely, in the range where the ratio of volumes is small, there is a large marginal decrease in the spring constant relative to the amount of increase in the volume of the second air chamber 63, and thus the effect regarding the decrease in stiffness is large, yet if the ratio of volumes is less than 1, the absolute value of the spring constant increases, and the stiffness will exceed that which is tolerable for the air spring. Because of this, in the present embodiment, the volume of the second air chamber 63 is set in a range of one to five times the volume of the first air chamber 61.

Figure 9:
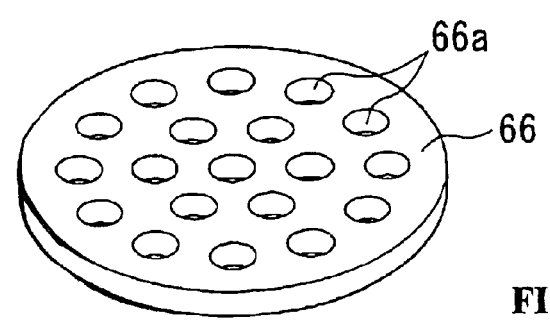
FIG. 9 is an external perspective drawing of the vibration-absorbing plate equipped in the connection between the first air chamber and the second air chamber.

Vibration absorption plates (i.e., a vibration absorbing device) 66, which absorbs the vibrations of the air in the duct 62, are provided in the duct 62. The vibration absorption plates 66, as shown in FIG. 9, are disks with multiple through-holes 66a. Here the vibration frequency f of the air in the duct 62 is given by the following formula:

$$f=c/2\pi)\overline{S/(L \times V)} \qquad (2)$$

where c=the speed of sound, S=the cross-sectional area of the duct, L=the length of the duct, and V=the volume of the air spring.

Furthermore, the through-holes 66a in the vibration absorbing plates 66 can function as an orifice part if the peak oscillation frequency band in the duct 62 is calculated based on Equation (2) and the diameters of the holes are set so as to be able to damp that frequency band.

Returning to FIG. 6, the voice coil motors 27 use electromagnetic force to drive the projection optical system PL in the Z direction, and are equipped independent of, and parallel to, the air mount 26 between the barrel platform 25 and the frame platform 8e that is provided protruding in the bottom support frame 8d.

Figure 10:
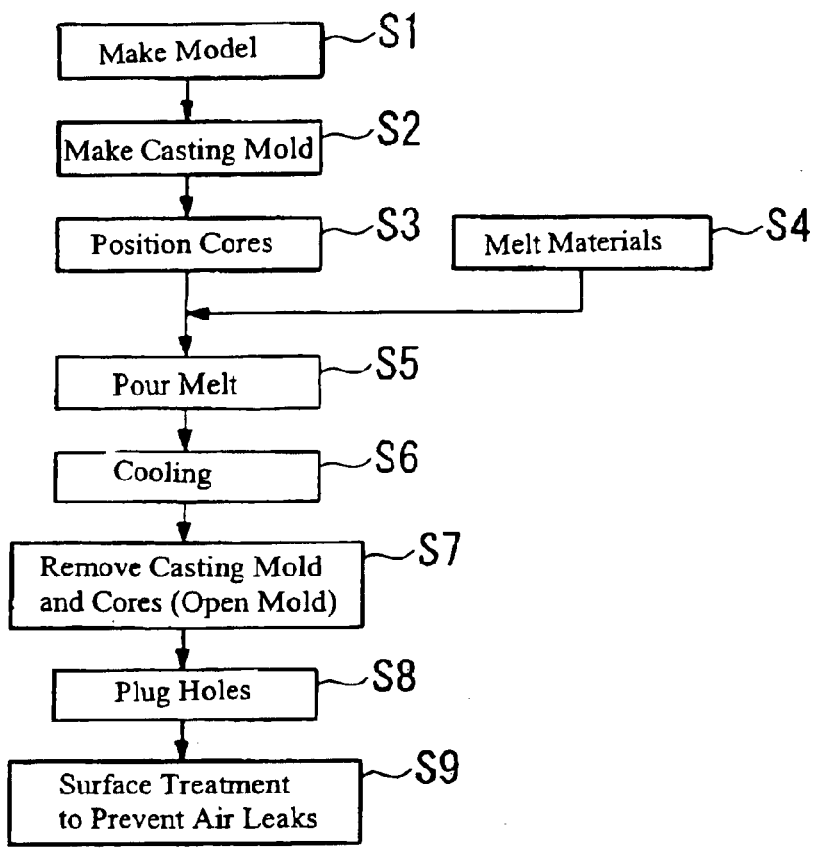
FIG. 10 is a flow chart showing a procedure for manufacturing the bottom support frame.
Figure 11:
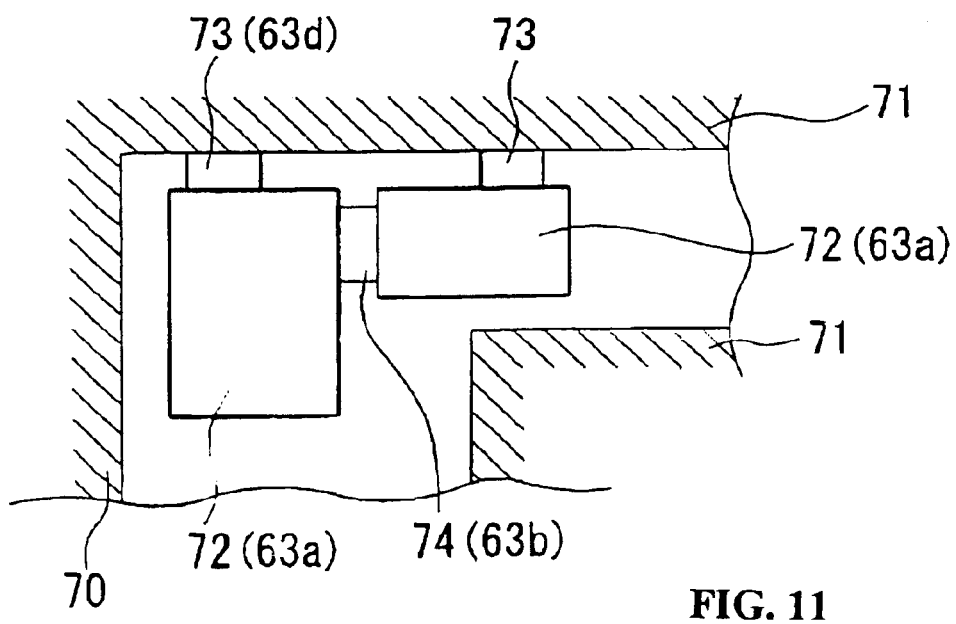
FIG. 11 is a partial cross-sectional drawing of a casting mold used for casting the bottom support frame.

The process for manufacturing the bottom support frame 8d, described above, will be explained using the flowchart shown in FIG. 10.

First, in step S1, wood, metal or the like is used to make a full-size scale model of the bottom support frame 8d. At this time, the size of the model should be somewhat on the large side to take into account the contraction of the casting.

Next, in step S2, after packing sand or the like around the model that has been made, the model is removed to form a casting mold (mold) 71 (see FIG. 11), in which the part that will be the casting of the model (or in other words, the bottom support frame 8d) is the hollow part 70.

After this, in step S3, cores (first cores) 72, for fabricating the hollow parts 65c (or in other words, the cavities 63a) are provided in the mold 71, and cores (second cores) 73, for forming the holes that will be used when removing the cores 72 after casting, are provided in contact with the cores 72 and the casting mold 71. Note that in the explanation below, of all of the multiple hollow parts 65c, reference will be made only to those that are used as the second air chamber 63.

Although these cores 72 and 73 are provided as pairs, a gap of a specified width between the cores is left in order to ensure the strength of the casting. Furthermore, the cores (third cores) 74, for fabricating the through parts 63b in the multiple indentation parts 63a used as the second air chamber 63, are located between adjacent cores 72.

In step S4, the material (the cast iron, etc.) that will become the casting is melted in parallel with the production of the casting mold (or after the casting mold has been made), and in step S5, the melt is cast into the hollow parts 70 inside the casting mold 71 through a casting hole (not shown) in the casting mold 71. After the casting mold 71 has been cooled (step S6) and the casting has hardened, the casting mold 71 and the cores 72 to 74 are removed (step S7). At this time, the cores 72 are removed through the holes fabricated in the casting by the removal of the cores 73, and the cores 74 are removed through the holes fabricated in the casting through the removal of the cores 72 and 73. This produces a bottom support frame 8*d* that has cavities 63*a* and through parts 63*b*.

However, in the casting of the bottom support frame 8*d* in this form, all of the cavities 63*a* are open to the outside because of the hole parts fabricated by the cores 73. Given this, of these multiple hole parts, all must be blocked (step S8), with the exception of the hole that will be the introduction aperture 63*d* which will be attached to duct 62 (in FIG. 11, the hole that is formed by the core 73 farthest to the left). As the means by which to block (the holes) a method such as attaching a cover to the outer surface of the casting can be used. Following this, in step S9, the surfaces of the cavities 63*a* that will be used as the second air chamber 63, and the surfaces of the through parts 63*b*, are coated with a surface treatment material 63*e* (see FIG. 6). These processes fabricate a bottom support frame 8*d* that has a second air chamber 63.

After this, the reaction frame 8 can be fabricated by connecting this bottom support frame 8*d* and the top support frame 8*c*. In the air mount 26, not only is the first air chamber 61 disposed on top of the bottom support frame 8*d*, but also the first air chamber 61 and the second air chamber 63 are connected by a duct 62, and thus the inner space 83 of the first air chamber 61 and the cavities 63*a* of the second air chamber 63 are connected, making it possible to obtain an air spring with a volume that is the sum of both of the volumes.

The operation of the anti-vibration units 24 will be explained next. When the reticle stage 2 or the wafer stage 5 is moved, the counterforce that cancels the effects of the change in the center of mass accompanying the movement of each stage is fed forward to the anti-vibration units 11 and 29, and the air mounts 12 and 30 and in voice coil motors 13 and 31 are driven to generate this force. Even when there is a minute vibration remaining in any of the directions of the six degrees of freedom of the platforms 3 and 6 because of reasons such as non-zero friction with the stages 2 and 5 and the platforms 3 and 6, feedback control is performed on the air mounts 12 and 30 and in the voice coil motors 13 and 31 to eliminate these remaining vibrations. In addition, the anti-vibration units 24 are controlled/driven when there is an effect on the bottom support frame 8*d* due to imbalance or a residual vibration caused by the movement of the aforementioned stages 2 and 5 or by driving the anti-vibration units 11 and 29.

Specifically, when the weight that should be borne by the anti-vibration units 24 increases, then, in the air mount 26, the controller 80 monitors the detection results of the pressure sensor 84 and switches the servo valve 85 to the air supply side. This causes air at a specified pressure (for example, 10 kPa) from the air pressure adjustment device to fill into the inner space 83 of the first air chamber 61 via servo valve 85, making it possible to increase the supporting force when supporting the barrel platform 25 (projection optical system PL) through the piston 87 and the frame 25*a*.

Additionally, the voice coil motor 27 is driven to apply a thrust force on the barrel platform 25 to compensate for any inadequacies in the supporting force when it comes to increases in the weight for which the supporting force of the air mount 26 is inadequate. Furthermore, when it comes to residual vibrations in the barrel platform 25, the air mount 26 and the voice coil motor 27 are driven, in the same manner as they were when there was a change in the center of mass, based on the results of detections by the set of vibration sensors in order to actively control the residual vibrations to insulate the minute vibrations that are propagated through the bottom support frame 8*d* to the barrel platform 25 (the projection optical system PL) to the micro-G level (where G is the acceleration due to gravity). Furthermore, when the mass that must be borne by the anti-vibration units 24 decreases and the pressure within the air mount 26 decreases, the servo valve 85 switches to the air release side to release air from the inner space 83.

When the residual vibrations are controlled as described above, the volume of the air mount 26, as an air spring, is formed from the volume of the first air chamber 61 and the volume of the second air chamber 63, and thus the spring constant is reduced, causing the air mount 26 to function as a low-stiffness air spring. Furthermore, because the through-holes 66*a* in the vibration-absorbing plate 66 in the air mount 26 function as orifice parts, the vibration peaks in the air in the duct 62 are dampened, reducing their negative effects tremendously.

The exposure operations in the exposure apparatus 1 will be explained next. Here it will be assumed that the various exposure parameters for the scanning exposure of the shot region on the wafer W have been set for the appropriate exposure dose (the target exposure dose). The reticle alignment, baseline measurements, and other preparatory work is performed using a reticle microscope, an off-axis alignment sensor, and the like (not shown), after which the alignment (EGA: enhanced global alignment, etc.) of the wafer W is completed using the alignment sensors, and the matrix coordinates of the multiple shot regions on the wafer W are calculated.

When, in this way, the preparatory operations for exposing the wafer W have been completed, the measurement values of the laser interferometer 44 are monitored based on the alignment results, and the linear motors 33 and 35 are controlled to move the wafer stage 5 to the scan start position for exposing the first shot region of the wafer W. After this, the scanning of the reticle stage 2 and the wafer stage 5 in the Y direction is started by the linear motors 15 and 33, and when both stages 2 and 5 achieve their respective target scan speeds, the exposure illumination beam from the illumination optical system IU illuminates the specific rectangular illumination region on the reticle R with a uniform illumination intensity. Synchronized with the scanning in the Y direction of the reticle R relative to this illumination region, the wafer W is scanned relative to the illumination region that is conjugate to this illumination region relative to the projection optical system PL.

The illumination beam that passes through the pattern region of the reticle R is reduced to 1/5 magnification or 1/4 magnification by the projection optical system PL and is caused to fall incident on the resist-coated wafer W. The patterns from the reticle R are transferred sequentially onto the exposure region of the wafer W, and the entire pattern region on the reticle R is transferred to the shot region on the wafer W in a single scan. At the time of this scanning exposure, the reticle stage 2 and the wafer stage 5 are subjected to synchronous control by the linear motors 15 and 33 in order to maintain a speed relationship between the speed of the movement of the reticle stage 2 in the Y direction and the speed of the movement of the wafer stage 5 in the Y direction according to the projection magnification ratio (1/5 magnification or 1/4 magnification) of the projection optical system PL.

The reaction force when the reticle stage 2 is accelerated or decelerated in the scanning direction is absorbed by the movement of the stator 20, so the position of the center of gravity in the stage device 4 remains essentially stationary in the Y direction. Furthermore, when there are some minute residual vibrations in any of the directions of the six degrees of freedom of the reticle platform 3, for reasons such as non-zero friction between the reticle stage 2, the stator 20, and the reticle platform 3, or because of a slight difference in the directions of movement of the reticle stage 2 and the stator 20, feedback control is exerted on the air mount 12 and on the voice coil motor 13 to eliminate these residual vibrations. In addition, in the barrel platform 25, as described above, even if there are minute vibrations due to the movement of the reticle stage 2 and the wafer stage 5, the vibrations in any of the directions of the six degrees of freedom are detected and feedback control is exerted on the air mount 26 and the voice coil motor 27 to cancel these minute vibrations, making it possible to maintain the barrel platform 25 (the projection optical system PL) at a constant stable position.

As described above, in this embodiment of the present invention, the second air chamber 63, which is connected to the first air chamber 61, is equipped in the bottom support frame 8d, and so it is possible to obtain a low-stiffness air spring with a large volume without increasing the size of the equipment. Furthermore, because the volume of the second air chamber 63 is set depending on the volume of the first air chamber 61 in this embodiment of the present invention, the volume can be set as appropriate in order to obtain a reduction in stiffness corresponding to the increased volume, with a stiffness that is within the tolerances for the air spring. Furthermore, because a vibration-absorbing plate 66, provided with orifices, is equipped in this embodiment of the present invention, the vibrations in the air in the duct 62 can be dampened easily, making it possible to control any adverse effects stemming from resonance and other vibrations in the air.

Furthermore, in this embodiment of the present invention, hollow parts fabricated in the bottom support frame 8d are used as the second air chamber 63, making it possible to reduce the processing steps for fabricating the second air chamber 63. Furthermore, because the volume of the second air chamber 63 can be adjusted by fabricating through parts 63b between the multiple indentation parts 63a, the optimal volume for the air spring can be obtained easily. Furthermore, in this embodiment of the present invention, the surfaces of the second air chamber 63 are coated with a surface treatment material 63e, making it possible to prevent the air from leaking out of the second air chamber 63, and making it possible to prevent any loss in functionality as an air spring.

In the embodiment described above the structure was one in which cavities in the frame were used as the second air chamber 63. However, the structure may instead be one in which a supplemental tank that serves as the second air chamber is embedded within the frame. In such a case, it is not necessary to consider blowholes from the casting process, eliminating the need for the surface treatment to prevent air leakage, thus making it possible to reduce the processing steps in manufacturing the frame. Additionally, in the embodiment described above, the structure was one in which a pressure sensor 84 and a servo valve 85 were provided in only the first air chamber 61. However, the present invention is not limited to this structure, but rather, for example, the structure may be one in which the pressure sensor 84 and the servo valve 85 are provided in the second air chamber 63 only, or provided in both the first and second air chambers.

Furthermore, in the embodiment described above, it was explained that the support device according to the present invention is applied to an anti-vibration unit 24 that supports a projection optical system PL through a barrel platform 25. However, the present invention is not limited to this structure, but rather the support device according to the present invention can be applied also to the anti-vibration unit 11 that supports the reticle stage 2, and to the anti-vibration unit 29 that supports the wafer stage 5. In such cases, it is possible to obtain a small stage device with a low-stiffness air spring. Furthermore, although in the embodiment described above the structure is one in which the support device according to the present invention is applied to an exposure apparatus 1, the support device according to the present invention is applicable also to transfer mask writing devices, mask pattern position coordinate measurement devices, and other high-precision measurement devices aside from exposure apparatus.

A second example of an embodiment of a support device, stage device, and exposure apparatus according to the present invention will be explained below, in reference to FIG. 12. In the exposure apparatus according to the second embodiment, the stage device according to the present invention is applied to the wafer stage, and the support device according to the present invention is applied to the anti-vibration unit that supports the platform for the wafer stage.

Figure 13:
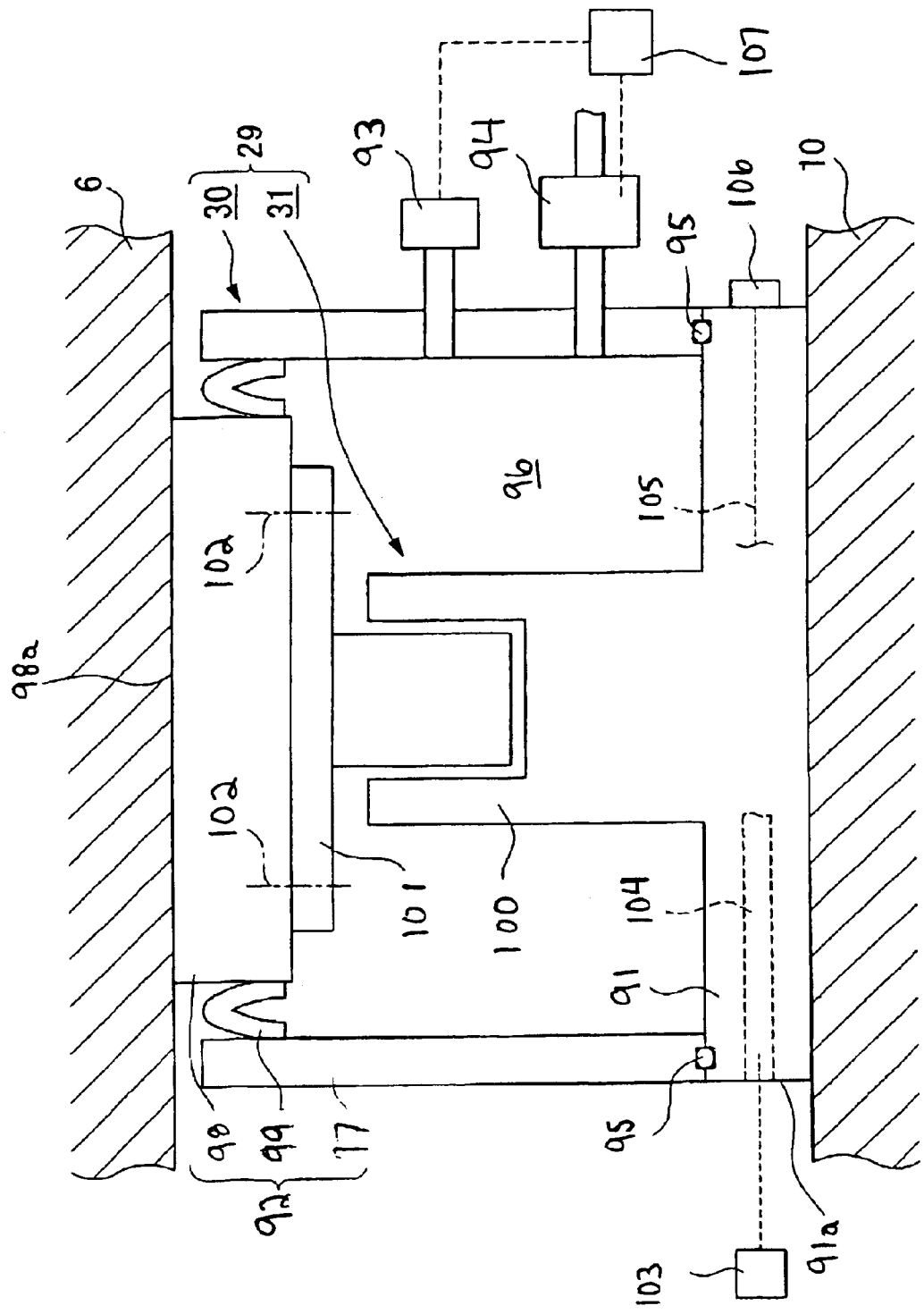
FIG. 13 is a schematic structural drawing of an anti-vibration unit of an exemplary embodiment of the present invention.

With the exception of the point that the voice coil motor 31 is equipped within the air mount 30, as shown in FIG. 13, for the anti-vibration unit 29 for the exposure apparatus in FIG. 12, the exposure apparatus 1 in FIG. 12 has essentially the same structure as the exposure apparatus 1 in FIG. 1, and so explanations regarding identical structural components are omitted.

The wafer platform 6 is supported, so as to be essentially level, by three anti-vibration units (support devices) 29 provided on the corners of a triangle on the base plate 10. FIG. 13 shows a schematic structural diagram of the anti-vibration unit. The anti-vibration unit 29 is structured mainly from an air mount (gas chamber) 30, which is filled with air (a gas) at a specified pressure and which uses this air to support the wafer platform 6, and a voice coil motor 31 (drive device) disposed within the air mount 30.

The air mount 30 is structured, basically, from: a base (wall material) 91, disposed on the base plate 10 and fabricated from a material such as aluminum or stainless steel that can withstand chemical cleaning; a main unit 92, which is attached to the base plate 91 using, for example, attachment screws, so as to be removable, and that maintains an airtight seal with an inner space 96, where there is an O-ring 95 (seal member) between the main unit 92 and the base 91; a pressure sensor 93 that detects the air pressure within the inner space 96; a servo valve 94, connected to an air pressure adjustment device, not shown, that increases or decreases the pressure in the inner space 96 by switching between increasing pressure and decreasing pressure; and a control device 107 that controls the servo valve 94 based on the detection results of the pressure sensor 93. The main unit 92 has a outer wall 97 that stands on the base 91, and a support surface 98a that supports the wafer platform 6, and is structured with a movable element 98, which supports the wafer platform 6 in the Z direction (the first direction), which is orthogonal to the support surface 98a, and a diaphragm (support member) 99, disposed between the outer wall 97 and the movable element 98, which supports the movable element 98 in such a way that it can move freely in the Z direction relative to the outer wall 97.

The voice coil motor 31 drives the wafer platform 6 in the Z direction using electromagnetic force, and comprises a stator 100, structured from a coil, that is equipped extending from the base 91, and a movable element 101 made from, for example, stainless steel, that moves in the Z direction relative to the stator 100. This movable element 101 is structured (fabricated) as an integrated unit by a linkage 102, such as attachment screws, with the movable element 98 of the air mount 30, and is structured from a permanent magnet in this second embodiment. The head part of the linkage 102 fits with the movable element 101, and the screw part screws into the movable element 98; however, in the movable element 98, the threaded part in which the screw part is secured is fabricated so as to not pass through to the top side (the wafer platform 6 side), so that the air in the inner space 96 will not leak out. Moreover, because the volume of the inner space 96 houses the voice coil motor 31, the volume must be set after taking into consideration the volume of the voice coil motor 31.

In addition, because the voice coil motor 31 produces heat when it is driven, a temperature adjustment device 103, which adjusts the temperature of the voice coil motor 31 using the flow of a cooling medium for temperature adjustments (the temperature adjustment medium), is attached. The base 91 is provided with a duct 104 through which the cooling medium moves, and the cooling medium flows into and out of the side surface 91a of the base 91, which is equipped with a gap from the outer wall 97, out of and into the duct 104. HFE (hydrofluoroethel) or fluorinate can be used as the cooling medium; however, in order to reduce the global warming factor, in this embodiment HFE is used for the perspective of global environmental protection because it has a zero ozone destruction factor.

Utility supply cables (utility supply ducts) 105, for supplying utilities such as power and drive signals to the voice coil motor 31, are equipped in the base 91. A terminal block 106, for connecting the utility supply cables 105 to outside cables, is equipped on the side surface 91a of the base 91.

The operation of the stage device 7 in the exposure apparatus, structured as described above, will be explained. When the wafer stage 5 is moved by driving the linear motors 33 and 35, a counterforce for canceling the effects of the change in the center of gravity accompanying the movement of the wafer stage 5, based on measured values by, for example, the laser interferometer 44, is fed forward to the anti-vibration unit 29, and the air mount 30 and the voice control motor 31 are driven so as to generate this force. Also, if there are residual minute vibrations in any of the directions of the six degrees of freedom in the wafer stage 5, due to, for example, non-zero friction between the wafer stage 5 and the wafer platform 6, feedback control is exerted on the air mount 30 and the voice coil motor 31 to eliminate the residual vibrations.

Specifically, when the weight that should be borne by the anti-vibration units 29 increases, then, in the air mount 30, the controller 107 monitors the detection results of the pressure sensor 93 and switches the servo valve 94 to the air supply side. This causes air at a specified pressure (for example, 10 kPa) from the air pressure adjustment device to fill into the inner space 96 through the servo valve 94, making it possible to increase the supporting force that supports the wafer stage 5 through the movable element 98. Additionally, the voice coil motor 31 is driven to apply a thrust force on the wafer platform 6 through the movable element 101 (and the movable element 98) to provide for any inadequacies in the supporting force when it comes to increases in the weight for which the supporting force of the air mount 30 is inadequate. Furthermore, when it comes to residual vibrations in the wafer platform 6, the air mount 30 and the voice coil motor 31 are driven, in the same manner as they were when there was a change in the center of gravity, based on the results of detections by the set of vibration sensors in order to actively control the residual vibrations to insulate the minute vibrations that are propagated through the base plate BP to the wafer platform 6 to the micro-G level (where G is the acceleration due to gravity).

Note that because the force that is applied on the wafer platform 6 by driving the air mount 30 and by driving the voice coil motor 31 is applied from the movable element 98 and the movable element 101, which are fabricated as a single unit, is possible to not only apply a thrust and provide support that is stable when compared to the case where forces are applied to the wafer platform 6 along multiple different locations, but also possible to improve control performance.

Furthermore, even though heat is produced when the voice coil motor 31, described above, is driven, the heat is absorbed through heat exchange by the flow, in the flow duct 104 of the stator 100, which is structured from a coil, of a cooling medium for which the temperature has been adjusted by a temperature adjustment device 103. Furthermore, the heat that is produced by the voice motor coil 31 is sealed within the inner space 96, making it possible to reduce the heat produced by the anti-vibration unit 29. Furthermore, when the mass that must be borne by the anti-vibration unit 29 is reduced by the movement of the wafer stage 5, and the air pressure within the air mount 30 is reduced, the servo valve 94 is switched to the release side to release air from the inner space 96; however, air for which the temperature has increased due to the heat generated by driving the voice coil motor 31 will be released, which will play a role in cooling the voice coil motor 31.

The duct 104, for the flow of the cooling medium, is an opening in the side surface 91 a, which has a gap with the outside wall 97, in the air mount main unit 92, and thus there is no need to perform a seal process on the outside wall 97. Similarly, because the utility supply cables 105 also enter into the base 91 from the side surface 91a, there is no need to perform a seal process to prevent air leaks, as would be the case if the outside wall 97 were penetrated. Furthermore, maintenance operations and the operations involved in connecting the utility supply cables 105 to external equipment can be simplified by mounting the terminal block 106, which is used for connecting the utility supply cables 105, on the outside of the side surface 91a.

As described above, in the present embodiment, the voice coil motor 31 is disposed inside of the air mount 30, and thus the support force and the driving force relative to the wafer platform 6 are coaxial, making it possible to prevent having to increase the size of the exposure apparatus while maintaining the wafer platform 6 in a state in which it has no deformations (because no torques will act on the wafer stage 6). Because of this, in the present embodiment, it is possible to avoid increases in size in the equipment while still being able to prevent any decreases in exposure resolution, making it possible to handle device miniaturization. Furthermore, in the present embodiment, the voice coil motor 31 is disposed within the air mount 30, so the heat that is generated by the voice coil motor 31 is sealed within the inner space 96, not only making it possible to control the adverse effects of heat at the outside of the anti-vibration unit 29, but also making it possible to exhaust the heat, generated when the voice coil motor 31 is driven, when releasing the air from the inner space 96.

Furthermore, in the present embodiment, the movable element 98, which supports the wafer platform 6, and the movable element 101, which applies a thrust force, are fabricated as a single unit, not only making it possible to provide a stable support force and thrust force without factors such as outside noises, but also making it possible to improve the level of control.

In addition, in the present embodiment, the air mount main unit 92 can be removed freely from the base 91, making it possible to perform maintenance and parts-replacement operations, and the like, with ease, thereby improving operational efficiency. Furthermore, interposing an O-ring 95 between the air mount main unit 92 and the base 91 can prevent the leakage of air from between these units. Additionally, in the present embodiment, the provision of a duct 104 for a cooling medium for adjusting the temperature of the voice coil 31 (and the air in the inner space 96), and the provision of utility supply cables 105, on the base 91, makes it unnecessary to perform the seal process that would be required if (the duct 104 and the utility supply cables 105) were equipped in the air mount main unit 92, both making it possible to avoid malfunctions stemming from seal failures, and contributing to reduced cost in the equipment. In addition, mounting the terminal block 106 so that it is exposed on the side surface 91a of the base 91 enables maintenance and operations for connecting the utility supply cables 105 to outside equipment to be performed with ease.

In the embodiment described above, the structure is one in which the support device according to the present invention was applied to an anti-vibration unit 29, which supports and drives the wafer stage 5 through the wafer platform 6. However, the present invention is not limited thereto, but rather can be applied also to, for example, the anti-vibration unit 11 that supports and drives the reticle stage 2 through the reticle platform 3, and to the anti-vibration unit 24 that supports and drives the projection optical system PL through the barrel platform 25. Furthermore, in the embodiment described above, the stage device according to present invention is applied to a stage device 7 for an exposure apparatus; however, it can also be applied to transfer mask writing devices, mask pattern position coordinate measurement devices, and other high-precision measurement devices, aside from exposure apparatus.

Furthermore, the first embodiment of the present invention and the second embodiment of the present invention can be combined as appropriate. For example, in the first embodiment, the voice coil motor 31 can be placed within the air mount 30 to make the voice coil motor 31 and the air mount 30 coaxial. Furthermore, the air mount 31 in the second embodiment can be connected to the second air chamber 63 in the first embodiment.

The substrate in these embodiments is not limited only to semiconductor wafers W for semiconductor devices, but rather glass substrates for liquid crystal display devices, ceramic wafers for thin film magnetic heads, and mask and reticle blanks (synthetic quartz and silicon wafers) used in exposure apparatus are also applicable.

Aside from the step-and-scan type scanning exposure equipment (scanning stepper; see, e.g., U.S. Pat. No. 5,473, 410) that performs scanning exposure of the pattern of the reticle R by moving the reticle R and the wafer W synchronously, the step-and-repeat type projection exposure apparatus (stepper), which exposes the pattern of the reticle R with both the reticle R and the wafer W held stationery and then sequentially steps the wafer W, is also applicable as the exposure apparatus 1. Furthermore, the present invention can also be applied to step-and-stitch type exposure apparatus in which two or more patterns are overlaid partially and exposed on the wafer W.

The types of exposure apparatus 1 are not limited to exposure apparatus for semiconductor manufacturing in which semiconductor patterns are exposed onto a wafer W, but rather exposure apparatus for liquid crystal display element manufacturing or display manufacturing, exposure apparatus for manufacturing thin film magnetic heads, photographic elements (CCDs), reticles and masks, and so forth, are also applicable.

Furthermore, for the exposure light source, not shown, not only are the bright lines from a high-pressure mercury lamp (the g-line (436 nm), the h-line (404 nm), and the i-line (395 nm)), and KrF excimer lasers (248 nm), ArF excimer lasers (193 nm), F2 lasers (157 nm), and Ar2 lasers (126 nm) applicable, but electron beams and ion beams, and other charge particle beams, can be used as well. For example, when using an electron beam, the thermal-electron radiation from lanthanum hexaborite (LaB6) or tantalum (Ta) may be used. Additionally, high-frequencies such as from YAG lasers or semiconductor lasers may also be used.

For example, the high frequencies from amplifying a monochromatic laser in the infrared domain or the visible domain, produced by a DFB semiconductor laser or a fiber laser, using, for example, an erbium-doped fiber amplifier (or a fiber amplifier doped with both erbium and ytterbium) and then using a non-linear optical crystal to convert the wavelength into ultraviolet light may be used. Note that when a monochromatic laser that produces light in the range of 1.544 to 1.553 microns is used, an ultraviolet beam in the range of 193 to 194 nm can be obtained using 8× frequency multiplying, or in other words, essentially the same wavelength can be obtained as for an ArF excimer laser, and when the wavelength produced is between 1.57 and 1.58 microns, and ultraviolet beam in the range of 157 to 158 nm can be obtained using 10× frequency multiplying, or in other words, essentially the same wavelength can be obtained as for an F2 laser.

Furthermore, the soft x-ray domain, with wavelength between about 5 and 50 nm, generated by laser plasma sources or SOR can be used as exposure beams, as can, for example, extreme ultraviolet (EUV) beams at, for example, wavelength of 13.4 nm or 11.5 nm, where the projection optics system can be condensed in size using only multiple (for example, 3 to 6) reflective optical elements (mirrors).

The magnification ratio of the projection optical system PL need not necessarily be reduction, but instead may have a 1:1 magnification ratio, or may magnify (enlarge) the image. Furthermore, for the projection optical system PL, if a far ultraviolet beam, such as from an excimer laser, is used (for the exposure beam), then materials such as quartz or borite, which are transparent to far ultraviolet light, should be used as the glass material; if an F2 laser or an x-ray is used (for the exposure beam), then a reflective/refractive system or a reflective system should be used for the optical system (where a reflective reticle R can be used as well); and if an electron beam is used (for the exposure beam), then and electron optical system made from electron lenses and deflectors should be used. Of course, the optical path traversed by the electron beam should be under vacuum.

When linear motors (see, e.g., U.S. Pat. No. 5,923,853 or U.S. Pat. No. 5,528,118) are used for the wafer stage 5 and the reticle stage 2, either an air-levitation type, using an air bearing, should be used, or a magnetic-levitation type, using either Lorenz forces or reactance forces, should be used. Furthermore, both stage 2 and stage 5 may be of the type that moves along a guide, or may be of the type in which no guide is provided.

The drive mechanisms for both stage 2 and stage 5 can be flat motors that drive these stages 2 and 5 using the electromagnetic forces between magnetic units, in which magnets (permanent magnets) are disposed in two dimensions, and electromagnetic element units, in which coils are disposed in two dimensions. In such cases, either the magnet unit or the electromagnetic element unit would be connected to the stage 2 or 5, and the other unit (the electromagnetic element units or the magnet unit) would be equipped on the surface on which the stage 2 or 5 moves (i.e., the base).

As described above, the exposure apparatus 1 according to the present embodiment is manufactured by assembling the various subsystems, doing so in such a way as to ensure specific mechanical precision, electrical precision, and optical precision. In order to ensure these types of precision, after the exposure apparatus is assembled, adjustments are made to the various optical systems in order to achieve optical precision, adjustments are made to the various mechanical systems in order to achieve mechanical precision, and adjustments are made to the various electrical systems in order to achieve electrical precision. The processes for assembling the various subsystems into the exposure apparatus include, for example, making mechanical connections, connecting cables for electric circuits, connecting ducts for pressure circuits, and the like, between the various subsystems. Each of these various subsystems, of course, has its own individual assembly process before the subsystems are assembled into the exposure apparatus. Once the process by which the various subsystems are assembled into the exposure apparatus has been completed, overall adjustments are made in order to secure the various types of precision in the exposure apparatus as a whole. The manufacturing of the exposure apparatus should be done in a clean room in which the temperature and cleanliness are controlled.

Figure 14:
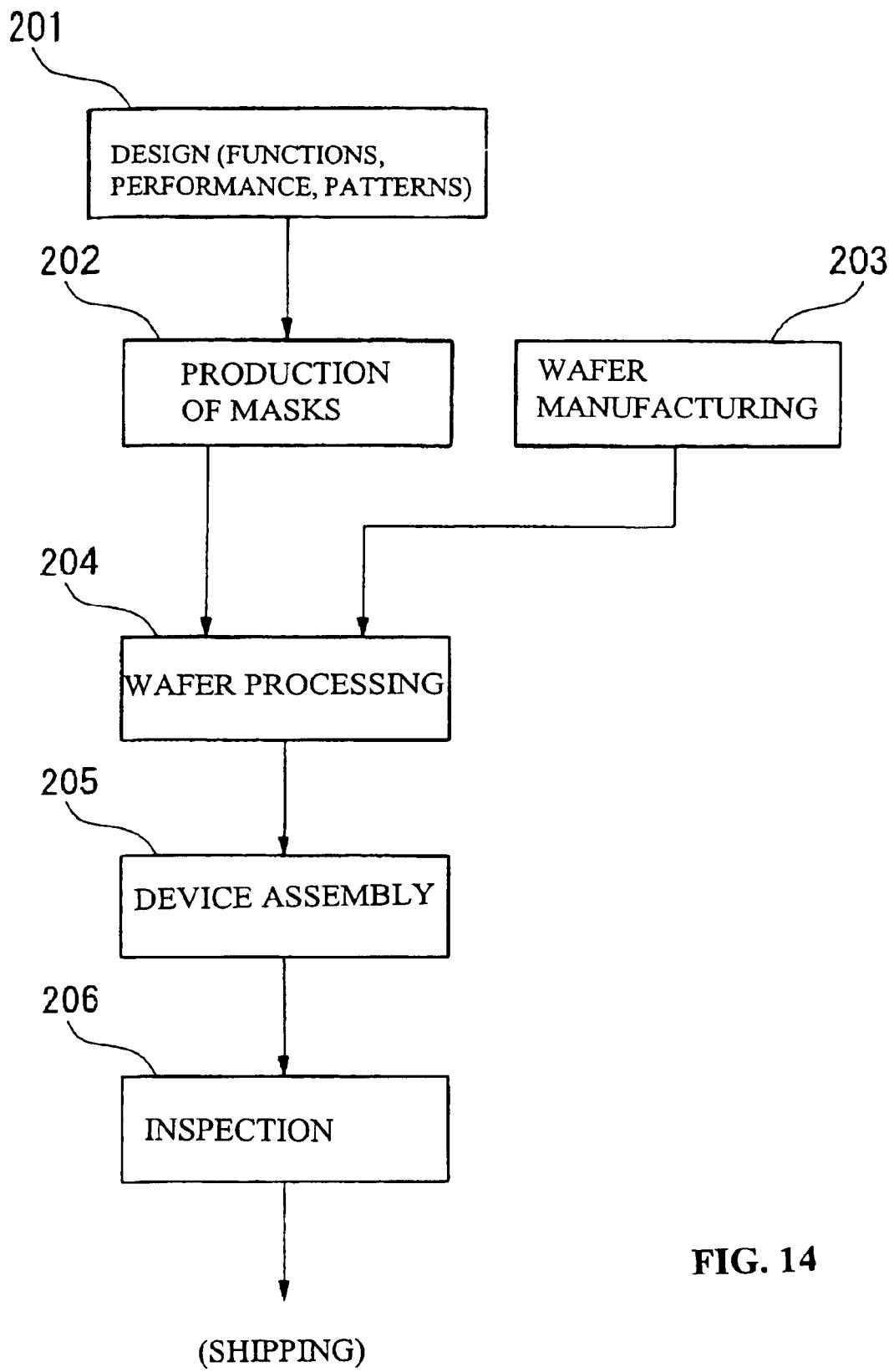
FIG. 14 is a flow chart showing an example of a manufacturing process for semiconductor devices.

Microdevices such as semiconductor devices are manufactured, as shown in FIG. 14, by performing a step 201 in which the functions and performance of the microdevice are designed, a step 202 in which masks (reticles) are produced based on the design step, a step 203 in which wafers are manufactured from silicon material, an exposure process step 204 in which the pattern from a reticle is exposed onto a wafer using the exposure apparatus according to the invention, a device assembly step (including the dicing process, bonding process, and packaging process) 205, and an inspection step 206, etc.

As explained above, the present invention not only makes it possible to obtain an air spring with a large volume and a low stiffness without increasing the size of the equipment, but also makes it possible to establish the volume of the air spring as appropriate in order to reduce the stiffness according to the increased volume, within the stiffness tolerances. Furthermore, the present invention also makes it possible to control harmful effects stemming from vibrations in the gas in the connection part.

Furthermore, the present invention not only makes it possible to accommodate device miniaturization by preventing reductions in exposure precision while avoiding having to make the equipment larger, but also makes it possible to improve control and reduce costs.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. A support device comprising:
    a first gas chamber that is filled with a gas and that supports an object using the gas;
    a support frame that supports the first gas chamber; and
    a second gas chamber, connected to the first gas chamber, the second gas chamber is provided within the support frame.

2. The support device according to claim 1, wherein the second gas chamber includes multiple cavities provided within the support frame, and passages that interconnect the multiple cavities.

3. The support device according to claim 1, wherein a volume of the second gas chamber is set based on a volume of the first gas chamber.

4. The support device according to claim 3, wherein the volume of the second gas chamber is between one and five times the volume of the first gas chamber.

5. The support device according to claim 1, further comprising:
    a detector that detects an internal pressure of at least one of the first gas chamber and the second gas chamber; and
    a controller that controls the internal pressure based on detection results of the detector.

6. The support device according to claim 1, further comprising:
    a vibration absorption device located in a passage between the first gas chamber and the second gas chamber.

7. The support device according to claim 6, wherein the vibration absorption device includes a plurality of orifices that absorb vibrations in a specified frequency band.

8. The support device according to claim 1, further comprising:
    a surface treatment provided on an inner surface of the second gas chamber in order to prevent the gas from leaking out of the second gas chamber.

9. The support device according to claim 1, wherein the support frame is a casting.

10. The support device according to claim 1, further comprising:
    a drive that drives the object, using an electromagnetic force, in a direction in which the first gas chamber supports the object.

11. A stage device in which a stage unit moves on a platform, wherein the platform is supported by the support device according to claim 1.

12. An exposure apparatus that has a projection optical system that exposes a pattern of a mask that is supported on a mask stage onto a photosensitive substrate that is supported on a substrate stage, wherein at least one of the mask stage, the projection optical system, and the substrate stage, is supported by the support device according to claim 1.

13. A method of manufacturing the support device of claim 1, the method comprising:

forming a casting mold of the support frame by providing a first core within a hollow mold, and by providing a second core that is in contact with the first core and the hollow mold;

placing a molten material into the mold; and after the material that has been placed into the mold has cooled, the mold, the first core and the second core are removed to form the second gas chamber in the support frame.

14. The method according to claim 13, further comprising:

providing multiple pairs of the first core and the second core with spaces therebetween, and providing third cores in gaps between adjacent ones of the first cores; and blocking all but one of the multiple holes formed by the second cores in the support frame.

15. The method according to claim 13, further comprising:

performing a surface treatment on an inner surface of the second gas chamber to prevent gas from leaking out of the second gas chamber.

16. A method of manufacturing a support device that includes a first gas chamber, which is filled with a gas and that supports an object using the gas, and a support frame that supports the first gas chamber, the method comprising:

forming a casting mold of the support frame by providing a first core within a hollow mold, and by providing a second core that is in contact with the first core and the hollow mold;

placing a molten material into the mold; and after the material that has been placed into the mold has cooled, the mold, the first core and the second core are removed to form a second gas chamber that is arranged to connect to the first gas chamber.

17. The support device manufacturing method according to claim 16, further comprising:

providing multiple pairs of the first core and the second core with spaces therebetween, and providing third cores in gaps between adjacent ones of the first cores; and blocking all but one of the multiple holes formed by the second cores in the support frame.

18. The support device manufacturing method according to claim 16, further comprising:

performing a surface treatment on an inner surface of the second gas chamber to prevent gas from leaking out of the second gas chamber.

19. A support device that has a support surface that supports an object, the support device comprising:

a gas chamber that is filled with a gas, the object is supported by the gas in a first direction that is perpendicular to the support surface;

a drive that is located in the gas chamber, the object is driven in the first direction by an electromagnetic force provided by the drive; and a temperature adjustment device that adjusts a temperature of the drive by controlling a temperature of the gas in the gas chamber.

20. The support device according to claim 19, wherein:

the gas chamber has a main part, which has the support surface, and a wall member that is removable from the main part; and the drive has a stator, provided on the wall member, and a movable element that moves relative to the stator.

21. The support device according to claim 20, wherein a seal material is interposed between the main unit and the wall member.

22. The support device according to claim 20, further comprising:

a flow duct, in which a medium for temperature adjustment flows, fabricated in the wall member.

23. The support device according to claim 20, further comprising:

a utility supply duct, that supplies utilities to the drive, fabricated in the wall member.

24. The support device according to claim 20, wherein the movable element of the drive is integrated with the support surface.

25. The support device according to claim 19, further comprising:

a support member that supports the support surface in the first direction, so that the support surface can move.

26. A stage device in which a stage unit can move on a platform, wherein the platform is supported by the support device according to claim 19.

27. An exposure apparatus that has a projection optical system that exposes a pattern of a mask that is supported on a mask stage onto a photosensitive substrate that is supported on a substrate stage, wherein at least one of the mask stage, the projection optical system, and the substrate stage, is supported by the support device according to claim 19.

* * * * *